United States Patent
Joo

(10) Patent No.: US 9,905,298 B2
(45) Date of Patent: Feb. 27, 2018

(54) NONVOLATILE MEMORY DEVICE AND METHODS OF OPERATING THE SAME INCLUDING FLOATING A COMMON SOURCE LINE BASED ON AT LEAST ONE OF A PROGRAM COMMAND AND AN ACCESS ADDRESS

(71) Applicant: Sang-Hyun Joo, Suwon-si (KR)

(72) Inventor: Sang-Hyun Joo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/260,495

(22) Filed: Sep. 9, 2016

(65) Prior Publication Data

US 2017/0084337 A1    Mar. 23, 2017

(30) Foreign Application Priority Data

Sep. 17, 2015 (KR) .................. 10-2015-0131323

(51) Int. Cl.
| | |
|---|---|
| *G11C 16/04* | (2006.01) |
| *G11C 16/10* | (2006.01) |
| *G11C 16/08* | (2006.01) |
| *G11C 16/30* | (2006.01) |
| *G11C 16/32* | (2006.01) |

(52) U.S. Cl.
CPC .......... *G11C 16/10* (2013.01); *G11C 16/0483* (2013.01); *G11C 16/08* (2013.01); *G11C 16/30* (2013.01); *G11C 16/32* (2013.01)

(58) Field of Classification Search
CPC ..... G11C 16/0483; G11C 16/08; G11C 16/10; G11C 16/09; G11C 16/30; G11C 16/32

USPC ........... 365/185.12, 185.11, 185.23, 185.17, 365/185.18

See application file for complete search history.

(56) References Cited

U.S. PATENT DOCUMENTS

| | | |
|---|---|---|
| 7,679,133 B2 | 3/2010 | Son et al. |
| 8,154,929 B2 | 4/2012 | Kang |
| 8,553,466 B2 | 10/2013 | Han et al. |
| 8,559,235 B2 | 10/2013 | Yoon et al. |
| 8,654,587 B2 | 2/2014 | Yoon et al. |
| 8,804,430 B2 | 8/2014 | Lai et al. |

(Continued)

FOREIGN PATENT DOCUMENTS

| | | |
|---|---|---|
| KR | 20060099934 A | 9/2006 |
| KR | 20080022943 A | 3/2008 |

(Continued)

*Primary Examiner* — Connie Yoha
(74) *Attorney, Agent, or Firm* — Harness, Dickey & Pierce, P.L.C.

(57) ABSTRACT

A nonvolatile memory device includes a common source line connected to a plurality of cell strings. The cell strings each include a first selection transistor coupled to a string selection line, a second selection transistor coupled to a ground selection line, and a plurality of memory cells coupled to a plurality word-lines. The second selection transistors are commonly coupled to the common source line. A method of operating the nonvolatile memory device includes receiving a program command and an access address, and performing a program operation on a selected page according to the access address while floating the common source line. The common source line is floated based on at least one of the program command and the access address.

13 Claims, 21 Drawing Sheets

(56) References Cited

U.S. PATENT DOCUMENTS

| | | | |
|---|---|---|---|
| 2001/0005330 A1* | 6/2001 | Choi | G11C 16/10 365/185.17 |
| 2010/0039861 A1 | 2/2010 | Park et al. | |
| 2011/0085385 A1* | 4/2011 | Park | G11C 11/5621 365/185.22 |
| 2011/0233648 A1 | 9/2011 | Seol et al. | |
| 2012/0063235 A1* | 3/2012 | Yoon | G11C 16/3418 365/185.23 |
| 2012/0155186 A1 | 6/2012 | Chokan et al. | |
| 2013/0250690 A1 | 9/2013 | Lai et al. | |
| 2014/0063966 A1 | 3/2014 | Kim | |
| 2014/0064002 A1 | 3/2014 | Kwon et al. | |
| 2015/0085582 A1 | 3/2015 | Kim | |
| 2015/0221376 A1* | 8/2015 | Choi | G11C 16/10 365/185.11 |

FOREIGN PATENT DOCUMENTS

| | | |
|---|---|---|
| KR | 20100021246 A | 2/2010 |
| KR | 20120069532 A | 6/2012 |
| KR | 20140028729 A | 3/2014 |
| KR | 20140028732 A | 3/2014 |
| KR | 20150014906 A | 2/2015 |

\* cited by examiner

NONVOLATILE MEMORY DEVICE AND METHODS OF OPERATING THE SAME INCLUDING FLOATING A COMMON SOURCE LINE BASED ON AT LEAST ONE OF A PROGRAM COMMAND AND AN ACCESS ADDRESS

CROSS-REFERENCE TO RELATED APPLICATION

This U.S. Non-provisional application claims priority under 35 USC § 119 to Korean Patent Application No. 10-2015-0131323, filed on Sep. 17, 2015, in the Korean Intellectual Property Office (KIPO), the disclosure of which is incorporated by reference in its entirety herein.

BACKGROUND

1. Technical Field

Example embodiments relate generally to semiconductor memory devices, and more particularly to nonvolatile memory devices and methods of operating nonvolatile memory devices.

2. Discussion of the Related Art

Semiconductor memory devices may be classified into volatile semiconductor memory devices and nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc.

As high integration memory devices have recently become increasingly required, multi-bit memory devices storing multi-bit data in a memory cell have become more common.

SUMMARY

Example embodiments are directed to a method of operating a nonvolatile memory device, capable of enhancing performance and reducing power consumption.

Example embodiments are directed to provide a nonvolatile memory device performing the method.

According to example embodiments, a method of operating a nonvolatile memory device is provided. The nonvolatile memory device includes a common source line connected to a plurality of cell strings. Each of the cell strings includes a first selection transistor coupled to a string selection line, a second selection transistor coupled to a ground selection line and a plurality of memory cells coupled to a plurality of word-lines. The second selection transistors are commonly coupled to the common source line. The method includes receiving a program command and an access address, and performing a program operation on a selected page according to the access address while floating the common source line. The common source line is floated based on at least one of the program command and the access address.

In example embodiments, the nonvolatile memory device may include bit-lines connected to the plurality of cell strings. The performing the program operation may include selecting a word-line among the word-lines based on the access address, applying a program-inhibit voltage to a program-inhibit bit-line among the bit-lines, and beginning the floating the common source line before a voltage level of the program inhibit bit-line is saturated irrespective of a position of the selected word-line.

In example embodiments, the performing the program operation may include driving the common source line to a level of a ground voltage or a level higher than the ground voltage before the common source line is floated.

In example embodiments, the nonvolatile memory device may include bit-lines connected to the plurality of cell strings. The performing the program operation may include selecting a word-line among the word-lines based on the access address, comparing the access address with at least one reference address, floating the common source line before a voltage level of the program inhibit bit-line is saturated, and varying a timing of the floating the common source line according to a position of the selected word-line based on a result of the comparing the access address with the at least one reference address.

In example embodiments, the varying the time of the floating the common source line may include floating the common source line at a first timing if the access address is smaller than or equal to the at least one reference address. The first timing may begin before the voltage level of the program inhibit bit-line is saturated.

In example embodiments, the varying the time of the floating the common source line may include floating the common source line at a second timing if the access address is greater than or the at least one reference address. The second timing may begin before the voltage level of the program inhibit bit-line is saturated. The second timing may be later than the first timing.

In example embodiments, the at least one reference address may include a plurality of reference addresses. The plurality of word-lines may be grouped into a plurality of word-line groups based on the reference addresses, and the performing the program operation may include varying the timing of the floating the common source line for each of the word-line groups based on the result of the comparing the access address with the reference addresses.

In example embodiments, the varying the timing of floating the common source line may include beginning the floating the common source line earlier as the position of the selected word-line is nearer to the common source line.

According to example embodiments, a nonvolatile memory device includes a memory cell array, a common source line driver and a control circuit. The memory cell array includes a common source line connected to a plurality of cell strings. Each of the cell strings includes a first selection transistor coupled to a string selection line, a second selection transistor coupled to a ground selection line, and a plurality of memory cells coupled to a plurality of word-lines. The second selection transistors are commonly coupled to the common source line. The common source line driver is configured to apply a common source line voltage to the common source line. The control circuit includes a common source line controller that is configured to provide a driver control signal to the common source line driver based on a command and an access address. The common source line controller is configured to control the common source line driver using the driver control signal. The common source line controller is configured to control the common source line driver to float the common source line before a program operation is performed on a selected page according to the access address.

In example embodiments, the nonvolatile memory device may further include an address decoder configured to select a word-line during the program operation based on the access address. The memory cell array may include a substrate and bit-lines connected to the cell strings. The cell strings may be vertically arranged on the substrate. The common source line controller may control the common source line driver such that the common source line during the program operation to float the common source line before a voltage level of a program inhibit bit-line among the bit-lines is saturated irrespective of a position of a selected word-line.

In example embodiments, the common source line controller may include a register, a comparator and a driver control signal generator. The register may be configured to store at least one reference address. The comparator may be configured to compare the access address with the at least one reference address. The comparator may be configured to output a comparison signal and a difference signal. The comparison signal may indicate a result of comparison of the access address and the at least one reference address. The difference signal may indicate a difference between the access address and the at least one reference address. The driver control signal generator may be configured to generate the driver control signal in response to a mode signal and at least one of the comparison signal and the difference signal.

In example embodiments, the common source line driver may include a common source voltage generator, a voltage control signal generator, and a transistor. The common source voltage generator may be configured to generate the common source line voltage applied to the common source line based on a control signal from the control circuit. The voltage control signal generator may be configured to generate a common source line voltage control signal in response to the driver control signal. The transistor may include a first terminal coupled to the common source line, a second terminal configured to receive the common source line voltage, and a gate configured to receive the common source line voltage control signal.

In example embodiments, the memory cell control circuit may include bit-lines connected to the cell strings. The control circuit may be configured to control applying a program inhibit voltage to a program inhibit bit-line among the bit-lines during the program operation. The common source line driver, in response to the driver control signal, may be configured to float the common source line at a first timing before a voltage level of the program inhibit bit-line is saturated if the access address is smaller than or equal to the at least one reference address. The common source line driver, in response to the control signal, may be configured to float the common source line at a second timing before the voltage level of the program inhibit-line is saturated if the access address is greater than the at least one reference address. The first timing may be earlier than the second timing.

In example embodiments, the at least one reference address may include a plurality of reference addresses. The plurality of word-lines may be grouped into a plurality of word-line groups based on the reference addresses. The voltage control signal generator may be configured to control the common source line voltage control signal in response to the driver control signal such that the timing of floating the common source line is varied for each of the word-line groups by based on the access address and the reference addresses.

In example embodiments, the voltage control signal generator may be configured to control the common source line voltage control signal in response to the driver control signal such that the timing of floating the common source line becomes earlier as the position of the selected word-line is nearer to the common source line.

According to example embodiments, a nonvolatile memory device includes a memory cell array including a common source line and a plurality of bit-lines connected to a plurality of cell strings, and a control circuit connected to the memory cell array. The cell strings each include a plurality of memory cells serially connected between a first selection transistor and a second selection transistor. The first selection transistor is coupled to a string selection line. The second selection transistor is coupled to a ground selection line. The plurality of memory cells are coupled to a plurality of word-lines. The second selection transistors are commonly coupled to the common source line. The control circuit is configured to receive a program command and an address signal from outside. The control circuit is configured to generate a row address and a column address based on the address signal. The control circuit is configured to perform a program operation on a selected page while floating the common source line. The common source line is floated based on the program command and the row address.

In example embodiments, the control circuit may be configured to perform the program operation by selecting a word-line among the word-lines based on the row address, applying a program inhibit voltage to a program inhibit bit-line among the bit-lines, and beginning the floating the common source line before a voltage level of the program inhibit bit-line is saturated irrespective of a position of the selected word-line.

In example embodiments, the control circuit may be configured to apply a ground voltage or a level higher than the ground voltage to the common source line before floating the common source line during the program operation.

In example embodiments, during the program operation and after applying the ground voltage or the level higher than the ground voltage to the common source line, the control circuit may be configured to apply a program inhibit voltage to a program inhibit bit-line among the bit-lines, the control circuit may be configured to begin floating the common source line at a first timing or a second timing, based on the row address, before a voltage level of the program inhibit bit-line is saturated, and the second timing may be after the first timing.

In example embodiments, the plurality of memory cells may be stacked on top of each other in the cell strings.

According to a method of operating a nonvolatile memory device, the common source line may be floated at a timing before a voltage level of a program inhibit bit-line is saturated or a timing of floating the common source line is varied according to the position of the selected word-line such that a leakage current of the ground selection line may be reduced by increasing potential of a channel under the common source line without applying a voltage to the common source line although the program voltage is applied to the selected word-line. Therefore, a program disturbance may be prevented or reduced.

BRIEF DESCRIPTION OF THE DRAWINGS

Illustrative, non-limiting example embodiments will be more clearly understood from the following detailed description of the accompanying drawings. The drawings are not necessarily to scale, emphasis instead being placed upon illustrating principles of inventive concepts.

FIG. 19 illustrates an example to which the method of FIG. 18 is applied to.

DETAILED DESCRIPTION OF EXAMPLE EMBODIMENTS

Figure 1:
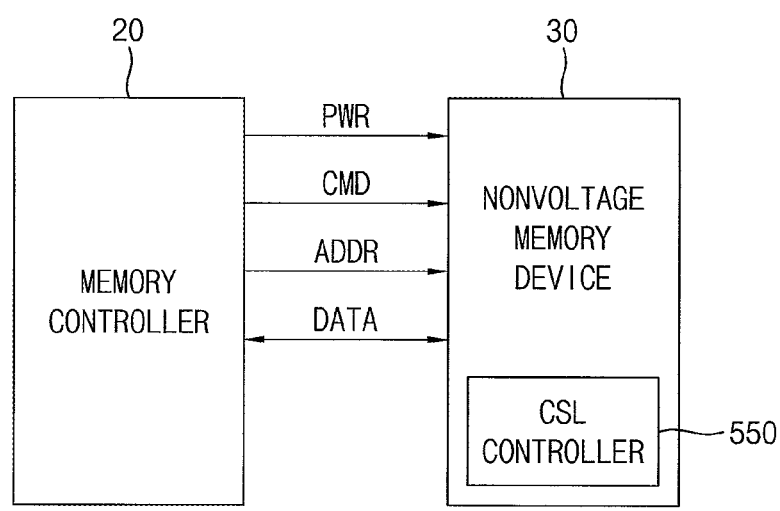
FIG. 1 is a block diagram illustrating a memory system according to example embodiments.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on," etc.).

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a memory system according to example embodiments.

Referring to FIG. 1, a memory system (e.g., a nonvolatile memory system) 10 may include a memory controller 20 and at least one nonvolatile memory device 30.

The memory system 10 may include flash memory based data storage media such as a memory card, a universal serial bus (USB) memory and solid state drive (SSD).

The nonvolatile memory device 30 may perform an erase operation, a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a power PWR through a power line from the memory controller 20. The command CMD may include a command latch enable (CLE), an address latch enable (ALE), a chip enable (CE/), a write enable (WE/) and a read enable (RE/), but is not limited thereto.

The nonvolatile memory device 30 may include a common source line controller 550 and the common source line controller 550 may control a common source line voltage applied to a common source line that is commonly coupled to cell strings of a memory cell array of the nonvolatile memory device 30.

Figure 2:
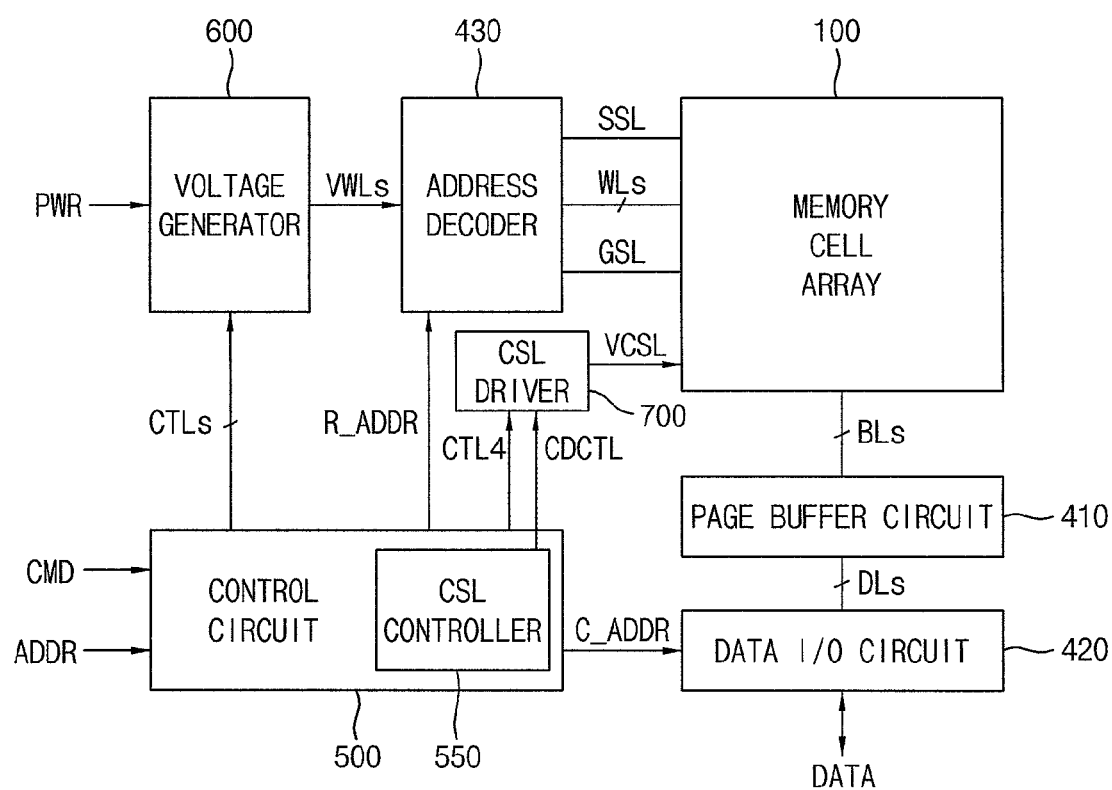
FIG. 2 is a block diagram illustrating the nonvolatile memory device in the memory system of FIG. 1 according to example embodiments.

FIG. 2 is a block diagram illustrating the nonvolatile memory device in the memory system of FIG. 1 according to example embodiments.

Referring to FIG. 2, the nonvolatile memory device 30 includes a memory cell array 100, an address decoder 430, a page buffer circuit 410, a data input/output circuit 420, a control circuit 500, a voltage generator 600 and a common source line (CSL) driver 700.

The memory cell array 100 may be coupled to the address decoder 430 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In example embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell.

The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648. In example embodiments, the 3D memory array may include vertical NAND strings that are vertically oriented such that at least one memory cell is located over another memory cell. The at least one memory cell may comprise a charge trap layer.

Alternatively, the memory cell array 100 may be a two-dimensional memory cell array, which is formed on a substrate in a two-dimensional structure (or a horizontal structure).

Figure 3:
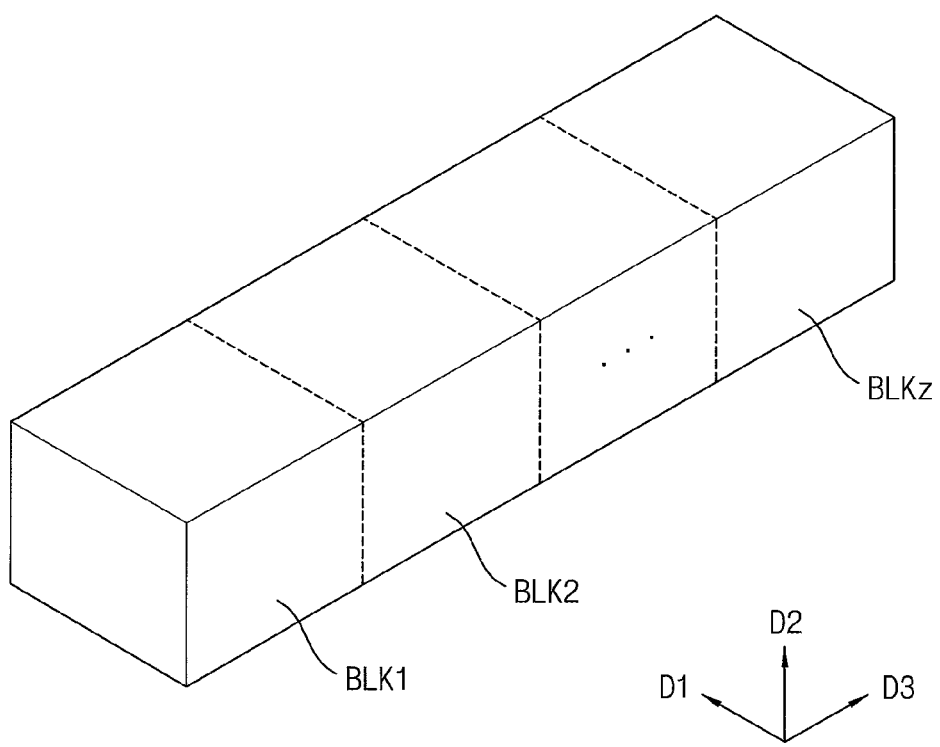
FIG. 3 is a block diagram illustrating the memory cell array in FIG. 2.

FIG. 3 is a block diagram illustrating the memory cell array in FIG. 2.

Referring to FIG. 3, the memory cell array 100 may include a plurality of memory blocks BLK1 to BLKz. In example embodiments, the memory blocks BLK1 to BLKz are selected by the address decoder 430 in FIG. 2. For example, the address decoder 430 may select a memory block BLK corresponding to a block address among the memory blocks BLK1 to BLKz.

Figure 4:
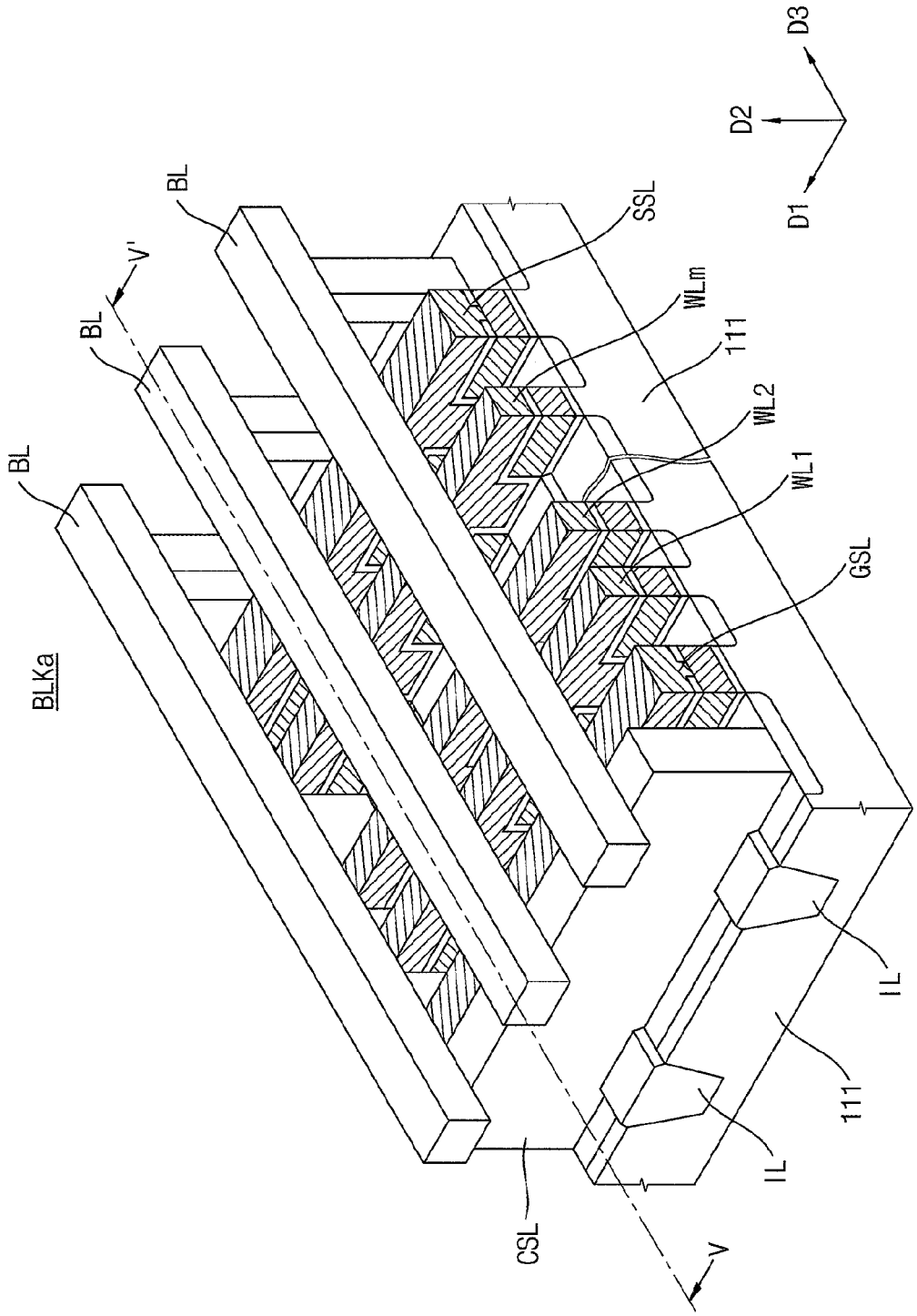
FIG. 4 is a perspective view illustrating one of the memory blocks of FIG. 3.
Figure 5:
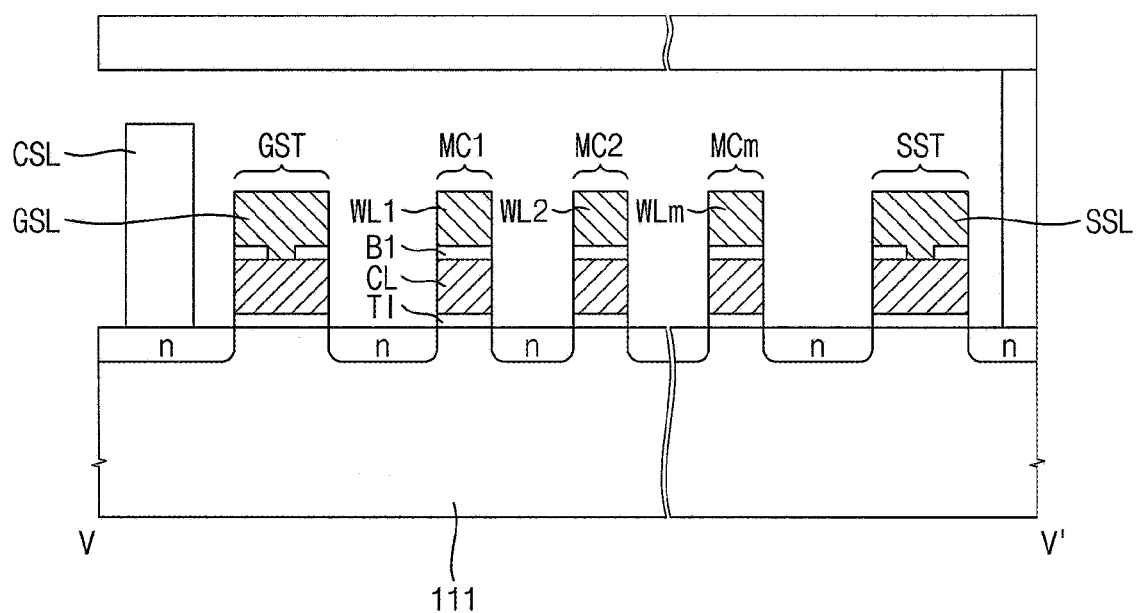
FIG. 5 is a sectional view taken along a line V-V' of the memory block of FIG. 4.

FIG. 4 is a perspective view illustrating one of the memory blocks of FIG. 3. FIG. 5 is a sectional view taken along a line V-V' of the memory block of FIG. 4.

Referring to FIGS. 4 and 5, a substrate 111 of the memory block BLKa is provided. For example, the substrate 111 may include a well having a p-conductive type.

A device isolation layer IL may be formed on the substrate 111 to define an active region. For example, trenches may be formed in the substrate and the device isolation layer IL may be formed in the trenches. An example is shown where three active regions extend along a third direction and are spaced along a first direction by a specific distance. However, the number of active regions is not limited.

A tunnel insulation layer TI is provided on each active region. The tunnel insulation layers TI may be spaced along the third direction by a specific distance. Each tunnel insulation layer TI may include an oxide layer. For example, each tunnel insulation layer TI may include a thermal oxide layer In each active region, charge storage layers CL are provided on the tunnel insulation layers TI. For example, the charge storage layers CL may include a conductive material such as polysilicon. For example, each charge storage layer CL may include a nitride layer or a metal oxide layer (e.g., an aluminum oxide layer, or a hafnium oxide layer).

If the charge storage layers CL include a conductive material such as polysilicon, the charge storage layers may operate as floating gates. That is, the charge storage layers CL store data by accumulating charges. If the charge storage layers CL include an insulation material, the charge storage layers operate as charge trapping layers. That is, the charge storage layers CL store data by trapping charges.

The tunnel insulation layers TI and charge storage layers CL are provided along a first direction D1 on a plurality of active regions. On an axial line where the tunnel insulation layers TI and the charge storage layers CL are provided along the first direction D1, block insulation layers BI are provided along the first direction D1. Each block insulation layer BI may include a nitride layer. Each blocking insulation layer BI may include a high-k dielectric layer (e.g., an aluminum oxide layer, or a hafnium oxide layer) having a higher dielectric constant than that of the tunneling insulation layers TI.

A polysilicon layer may be provided on the tunnel insulation layers TI. The polysilicon layer extends along the first direction D1 on a plurality of active regions. The polysilicon layer is spaced along a third direction D3 by a specific distance.

Each of the tunneling insulation layer TI, the charge storage layer CL, the blocking insulation layer BI, and the polysilicon layer constitutes a gate structure. In example embodiments, each of the tunneling insulation layer TI, the charge storage layer CL, the blocking insulation layer BI, and the polysilicon layer may constitute a memory cell MC.

In example embodiments, in a specific gate structure, perforation is formed in the blocking insulation layer BI such that the polysilicon layer and the charge storage layer CL may be connected. This gate structure may form a selection transistor SST or GST.

If the charge storage layer CL includes an insulation material, perforations may not be provided at a blocking insulation layer BI of a gate structure. That is, a charge storage layer CL and a control polysilicon layer of a gate structure of a selection transistor SST or GST may not be separated by a blocking insulation layer BI.

In example embodiments, a polysilicon layer forming a gate structure of a memory cell may extend along the first direction to form a word-line WL. In example embodiments, the polysilicon layer forming a gate structure of the selection transistor SST or GST extend along the first direction to form a selection line SSL or GSL.

Junction regions having an n conductive type are formed between gate structures. At this point, a source and a drain of a selection transistor SST or GST can be formed simultaneously. A conductive material extending along the first direction is provided on a source of a ground selection transistor GST. This conductive material forms a common source line CSL. The common source line CSL may include, for example, polysilicon. The common source line CSL may include, for example, metal.

A bit-line contact BP connected to a bit-line BL is provided on a drain of the string selection transistor SST. That is, a drain of the string selection transistor SST is connected to a corresponding bit-line BL through the bit-line contact BP. Bit lines are provided on the same axial line as the active regions. An example is provided, where three bit-lines are shown.

Figure 6:
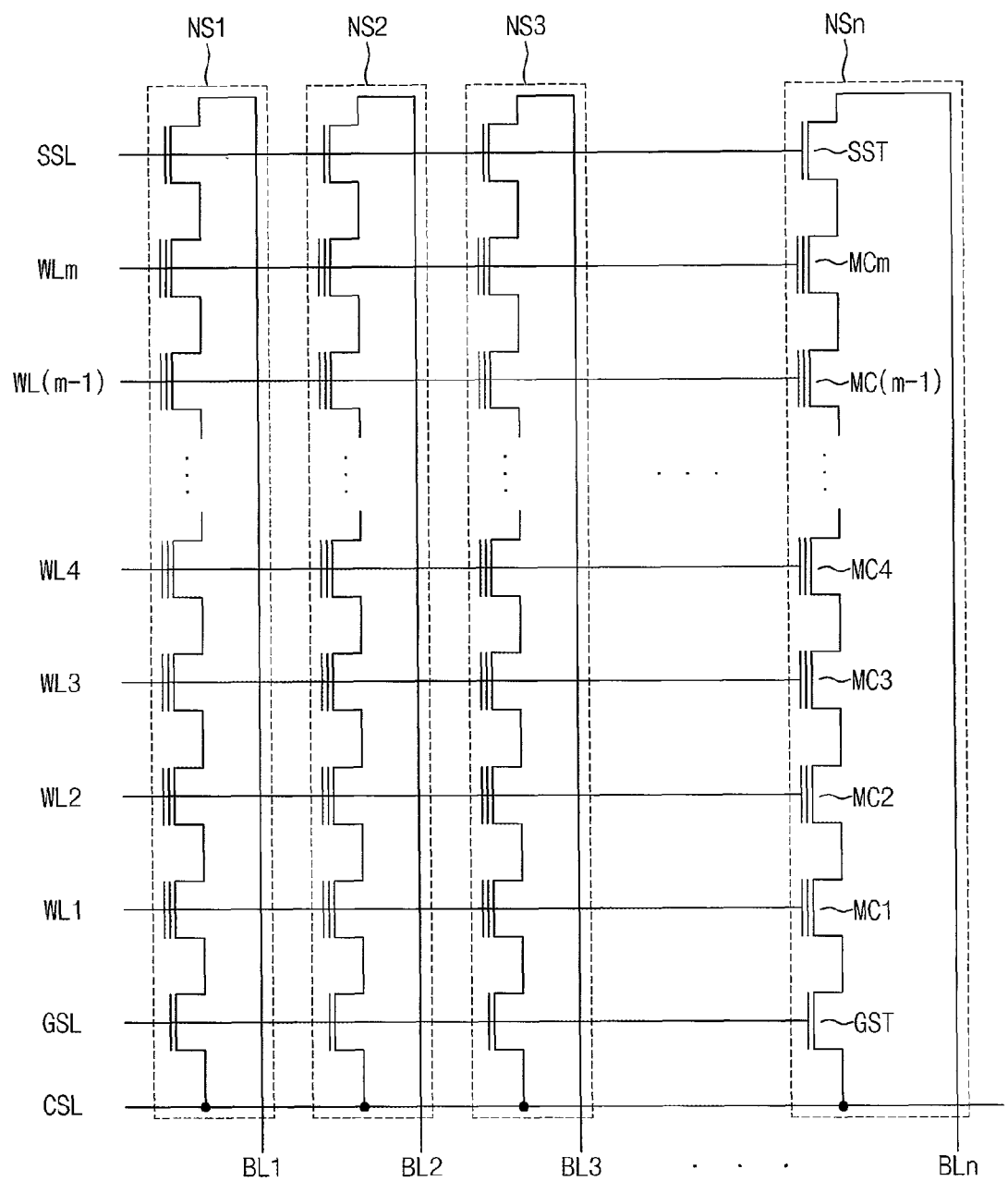
FIG. 6 is a circuit diagram illustrating an equivalent circuit of the memory block described with reference to FIGS. 4 and 5.

FIG. 6 is a circuit diagram illustrating an equivalent circuit of the memory block described with reference to FIGS. 4 and 5.

The memory block BLKa of FIG. 6 may be formed on a substrate in a two-dimensional structure (or a horizontal structure). For example, a plurality of memory cell strings included in the memory block BLKa may be formed in a direction parallel to the substrate.

Referring to FIG. 6, the memory block BLKa may include memory cell strings NS1 to NSm.

Each of the memory cell strings NS1 to NSm may include a string selection transistor SST, a plurality of memory cells MC, and a ground selection transistor GST that are serially connected to each other.

The string selection transistor SST included in each of the memory cell strings NS1 to NSm may be commonly connected to the string selection line SSL. Memory cells arranged in a same row among memory cells MC included in each of the memory cell strings NS1 to NSm may be commonly connected to corresponding word-lines WL1 to WLn. The ground selection transistor GST included in each of the memory cell strings NS1 to NSm may be commonly connected to the ground selection line GSL.

The ground selection transistors GST included in each of the memory cell strings NS1 to NSm may be commonly connected to the common source line CSL. The string selection transistor SST included in each of the memory cell strings NS1 to NSm may be connected to corresponding bit-lines BL1 to BLm. Here, n and m represent positive integers.

Figure 7:
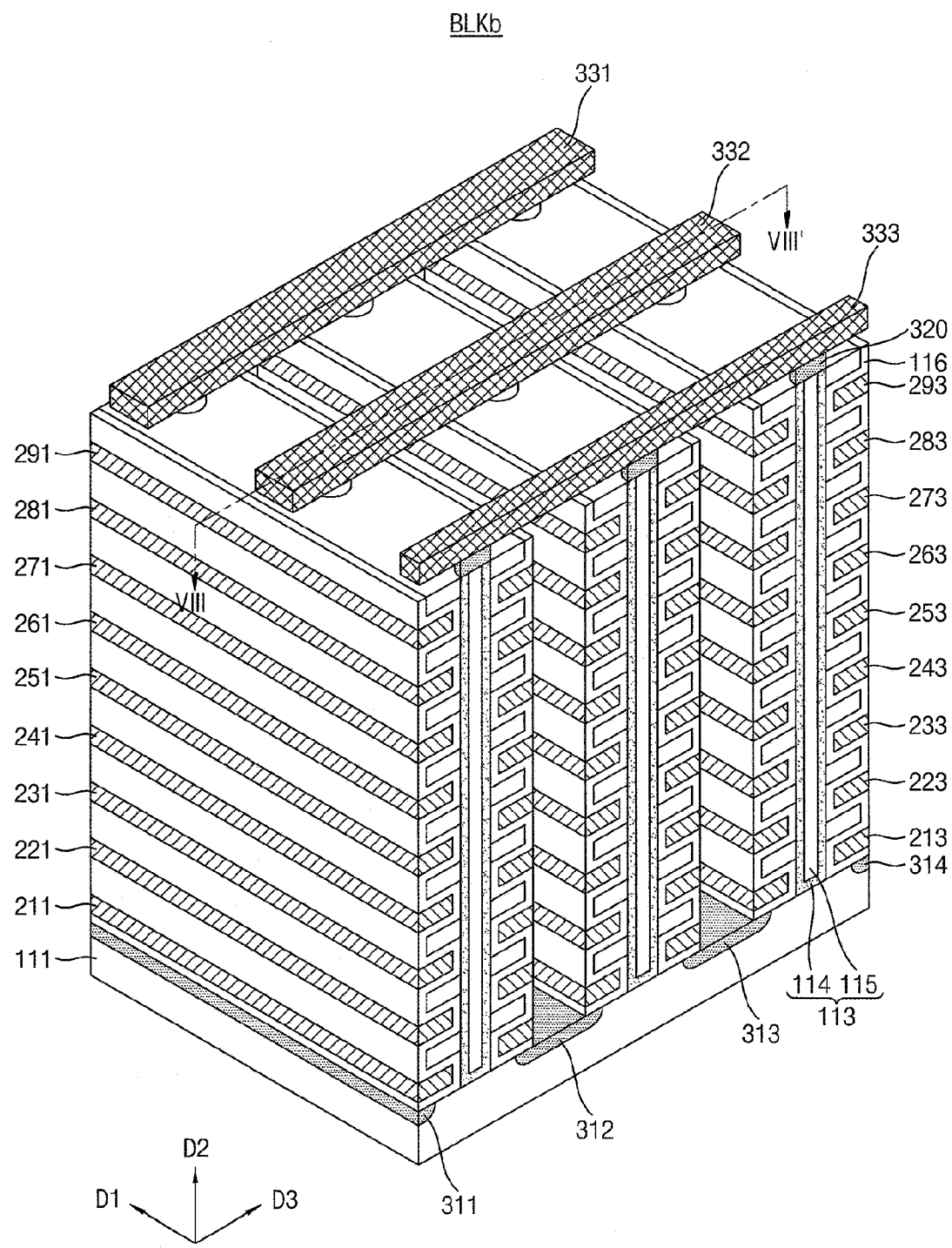
FIG. 7 is a perspective view illustrating one of memory blocks of FIG. 3.
Figure 8:
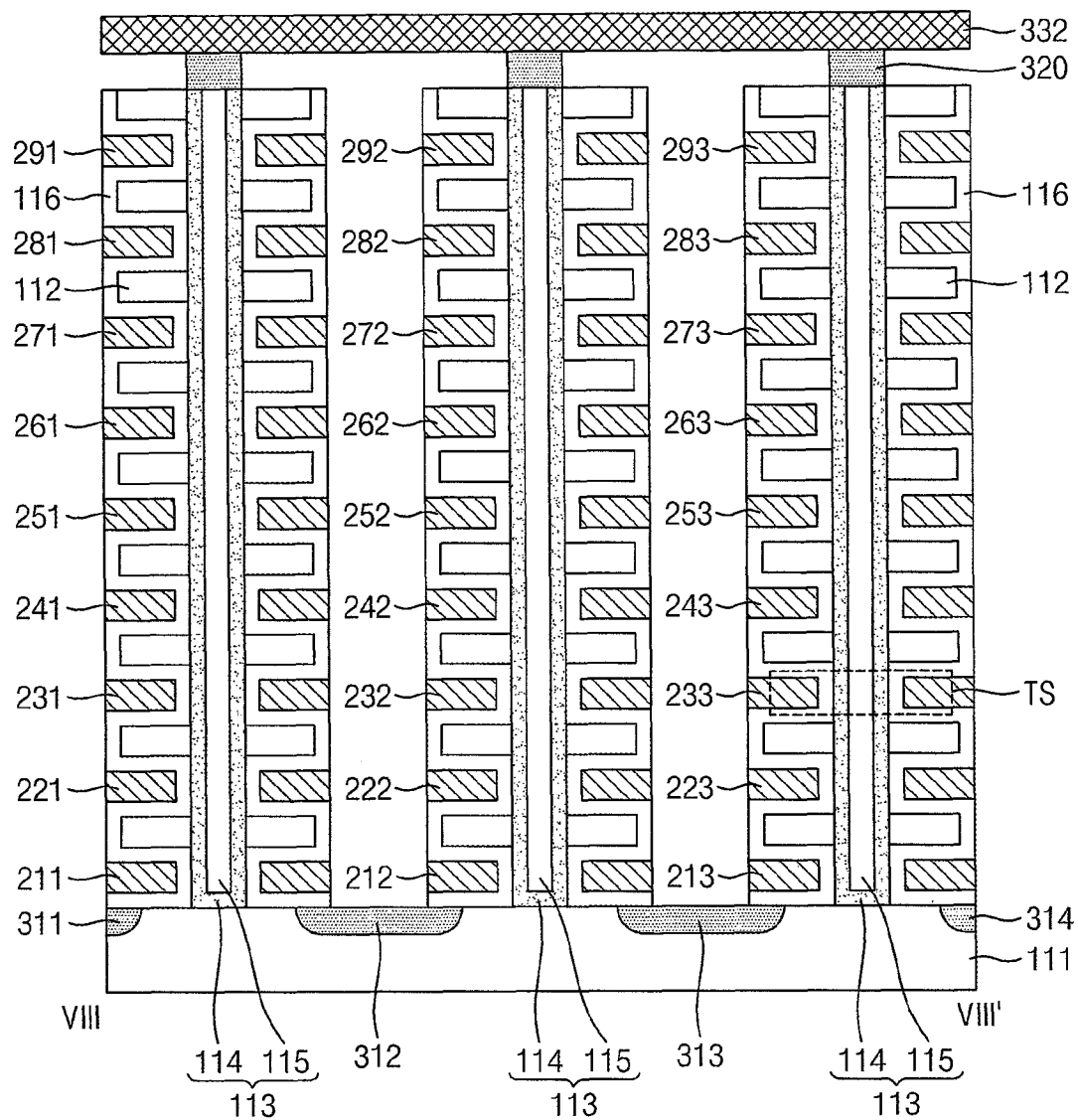
FIG. 8 is a sectional view taken along a line VIII-VIII' of the memory block of FIG. 7.

FIG. 7 is a perspective view illustrating one of memory blocks of FIG. 3. FIG. 8 is a sectional view taken along a line VIII-VIII' of the memory block of FIG. 7.

Referring to FIGS. 7 and 8, the memory block BLKb includes structures extending along the first to third directions D1~D3.

A substrate 111 is provided. For example, the substrate 111 may include a well of a first type (e.g., a first conductive type). For example, the substrate 111 may include a p-well formed by implanting a group 3 element such as boron (B). For example, the substrate 111 may have a pocket p-well provided in an n-well. In example embodiments, the substrate 111 has a p-type well (or a p-type packet well). However, the conductive type of the substrate 111 is not limited to the p-type.

A plurality of doping regions 311 to 314 extending along the first direction D1 are provided on the substrate 111. For example, the plurality of doping regions 311 to 314 may have a second type (e.g., a second conductive type) different from the first type of the substrate 111. In example embodiments, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction on a region of the substrate 111 between the first and second doping regions 311 and 312. For example, the plurality of insulation materials are provided along the second direction D2, being spaced by a specific distance. An example is provided, where the insulation materials 112 may include an insulation material such as an oxide layer.

A plurality of pillars 113 penetrating the insulation materials along the second direction D2 are sequentially disposed along the first direction on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In example embodiments, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. The insulation layer 116 provided on the exposed surface in the second direction D2 of the last insulation material 112 may be removed.

For example, the thickness of the insulation layer 116 may be less than the half of the distance between the insulation materials 112. That is, a region where a material besides the insulation materials 112 and the insulation layer 116 may be disposed is provided between the insulation layer 116 provided on the bottom of a first insulation material among the insulation materials 112 and the insulation layer 116 provided on the top of a second insulation material 116 at the bottom of the first insulation material. First conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. The drains 320 may include silicon materials doped with a second type. For example, the drains 320 may include silicon materials doped with an n-type. In example embodiments, the drains 320 include n-type silicon materials. However, the drains 320 are not limited to the n-type silicon materials.

The width of each drain 320 may be greater than that of the pillar 113. For example, each drain 320 may be provided in a pad form on the top of the corresponding pillar 113. Each drain 320 may extend to a portion of the channel layer 114 of the corresponding pillar 113.

On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Hereinafter, the heights of the first conductive materials 211 to 291, 212 to 292, and 213 to 293 are defined. It is defined that the first conductive materials 211 to 291, 212 to 292, and 213 to 293 sequentially have the first to ninth heights from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 7 and 8, the pillars 113, the insulation layer 116, and the plurality of first conductive materials 211 to 291, 212 to 292, and 213 to 293 form a string. For example, each pillar 113, an adjacent region of the insulation layer 116, and an adjacent region of the first conductive materials 211 to 291, 212 to 292, and 213 to 293 form a NAND string NS. The NAND string NS includes a plurality of transistor structures TS.

Figure 9:
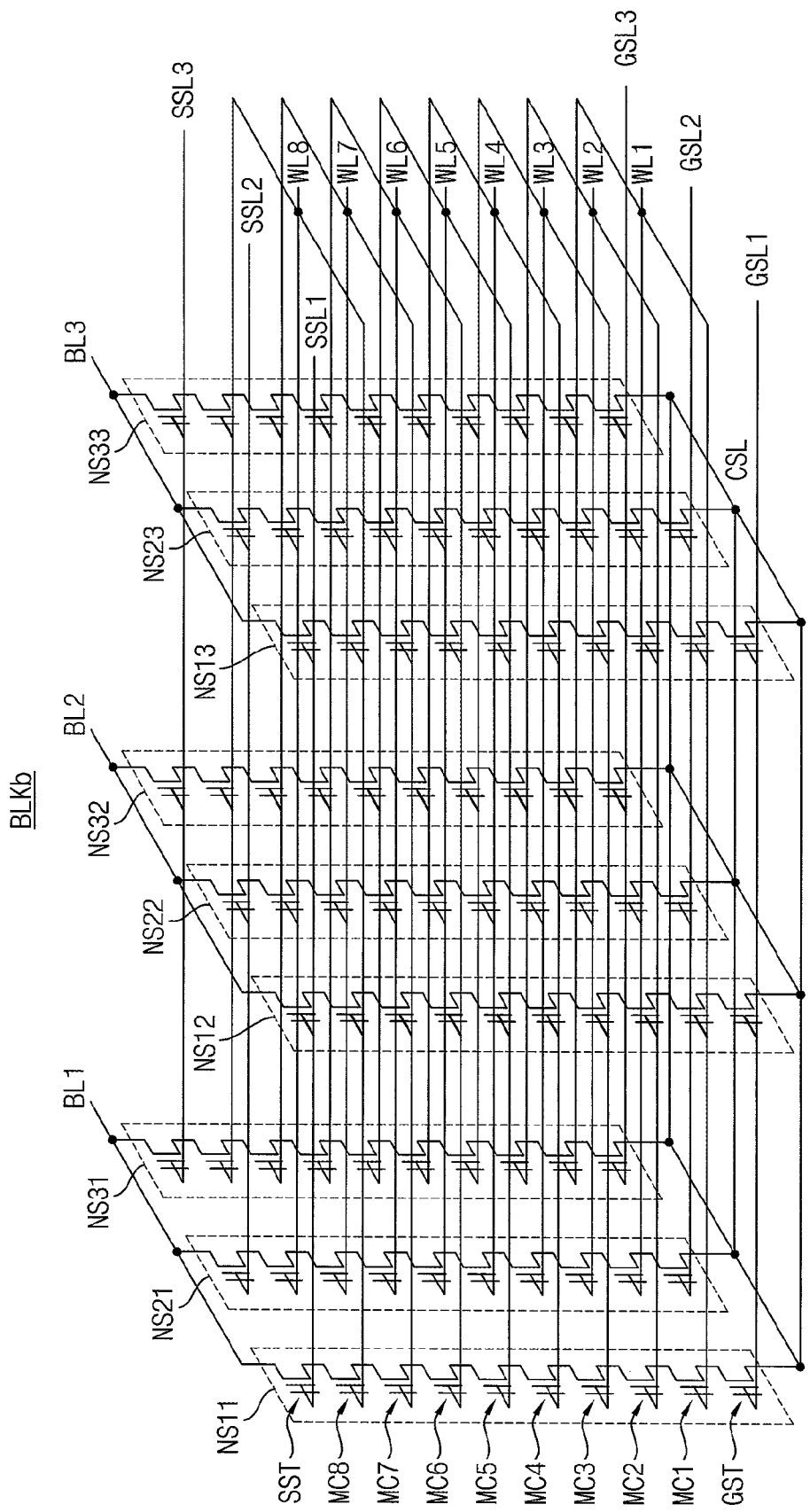
FIG. 9 is a circuit diagram illustrating an equivalent circuit of the memory block described with reference to FIGS. 7 and 8.

FIG. 9 is a circuit diagram illustrating an equivalent circuit of the memory block described with reference to FIGS. 7 and 8.

The memory block BLKb of FIG. 9 may be formed on a substrate in a three-dimensional structure (or a vertical structure). For example, a plurality of memory cell strings included in the memory block BLKb may be formed in a direction perpendicular to the substrate.

Referring to FIG. 9, the memory block BLKb may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 9, each of the memory cell strings NS11 to NS33 is illustrated to include eight memory cells MC1 to MC8. However, example embodiments are not limited thereto. In example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 9, the memory block BLKb is illustrated to be coupled to eight word-lines WL1 to WL8 and three bit-lines BL1 to BL3. However, example embodiments are not limited thereto. In example embodiments, the memory cell array 100a may be coupled to any number of word-lines and bit-lines.

Referring again to FIG. 2, the control circuit 500 may receive a command signal CMD and an address signal ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation.

According to example embodiments of inventive concepts, the control circuit 500 and CSL controller 550 included therein may include or be implemented by one or more circuits or circuitry (e.g., hardware) specifically structured to carry out some or all of the operations described herein as being performed by the control circuit 500 and the CSL controller 550. Alternatively, instead of using the control circuit 500, a control module may used instead. The control module be implemented by a memory and one or more processors executing computer-readable code (e.g., software) that is stored in the memory and includes instructions corresponding to some or all of the operations described herein as being performed by the control circuit 500 (and/or an element and/or sub-element thereof).

For example, the control circuit 500 may generate control signals CTLs, which are used for controlling the voltage generator 600, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420. The control circuit 500 includes a common source line controller 550. The common source line controller 550 may control the common source line driver 700 that applies a common source line voltage VCSL to the common source line CSL. The common source line controller 550 controls the common source line driver 700 by providing a driver control signal CDCTL to the common source line driver 700.

The address decoder 430 may be coupled to the memory cell array 100 through the string selection line SSL, the plurality of word-lines WLs, and the ground selection line GSL. During the program operation or the read operation, the address decoder 430 may determine one of the plurality of word-lines WLs as a first word-line (e.g., a selected word-line) and determine rest of the plurality of word-lines WLs except for the first word-line as unselected word-lines UNSEL_WL based on the row address R_ADDR.

The voltage generator 600 may generate word-line voltages VWLs, which are used for the operation of the nonvolatile memory device 10, based on the control signals CTLs. The voltage generator 600 may be embodied using one or more circuits or circuitry (e.g., hardware). The word-line voltages VWLs may be applied to the plurality of word-lines WLs through the address decoder 430.

For example, during the erase operation, the voltage generator 600 may apply an erase voltage to a well of the memory block and may apply a ground voltage to entire word-lines of the memory block. During the erase verification operation, the voltage generator 600 may apply an erase verification voltage to the entire word-lines of the memory block or sequentially apply the erase verification voltage to word-lines in a word-line basis.

For example, during the program operation, the voltage generator 600 may apply a program voltage to the first word-line and may apply a program pass voltage to the unselected word-lines. In addition, during the program verification operation, the voltage generator 600 may apply a program verification voltage to the first word-line and may apply a verification pass voltage to the unselected word-lines.

In addition, during the read operation, the voltage generator 600 may apply a read voltage to the first word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In example embodiments, one page buffer may be connected to one bit-line. Alternatively, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 410 may receive program data DATA from the memory controller 20 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 20 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

The common source line driver 700 may control a level of the common source line voltage VCSL applied to the common source line CSL or cut-off an application of the common source line voltage VCSL to float the common source line CSL, in response to the driver control signal CDCTL.

Figure 10:
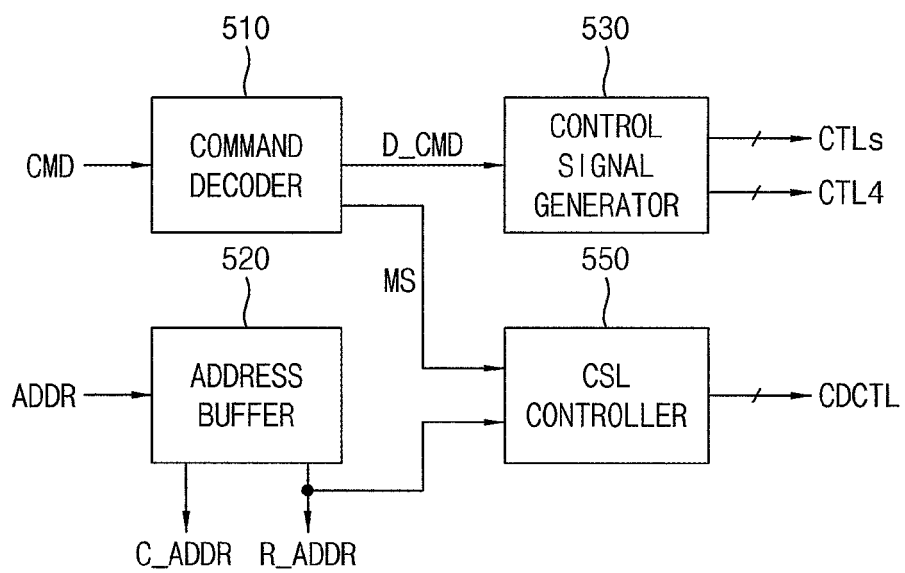
FIG. 10 is a block diagram illustrating the control circuit in the nonvolatile memory device of FIG. 2 according to example embodiments.

FIG. 10 is a block diagram illustrating the control circuit in the nonvolatile memory device of FIG. 2 according to example embodiments.

Referring to FIG. 10, the control circuit 500 includes a command decoder 510, an address buffer 520, a control signal generator 530, and the common source line controller 550.

The command decoder 510 decodes the command CMD and provides a decoded command D_CMD to the control signal generator 570. The command decoder 510 provides a mode signal MS to the common source line controller 550 when the decoded command D_CMD is a program command.

The address buffer 520 receives the address signal ADDR, provides the row address R_ADDR to the common source line controller 550 and the address decoder 430 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generator 600.

The common source line controller 550 generates the driver control signal CDCTL to control the common source line driver 700 based on the row address R_ADDR and the mode signal MS and provides the driver control signal CDCTL to the common source line driver 700. The common source line controller 550 may control the common source line driver 700 based on the row-address R_ADDR and the mode signal MS such that the common source line driver 700 may adjust or cut-off the common source line voltage VCSL applied to the common source line CSL based on a position of a selected word-line designated by the row-address R_ADDR when the command CMD corresponds to a program command.

Figure 11:
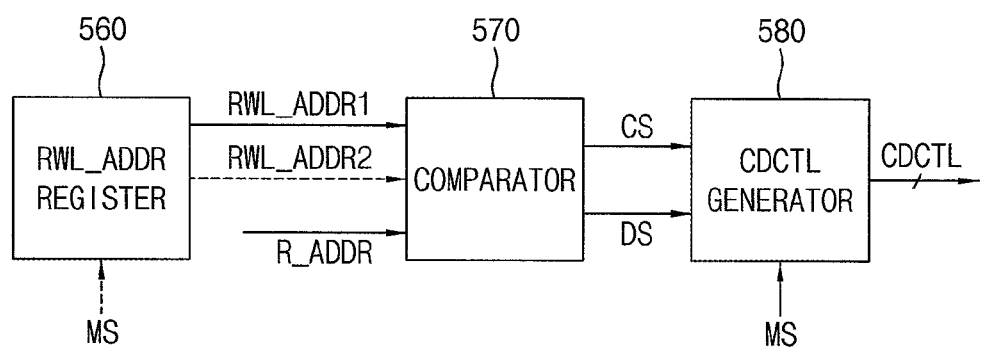
FIG. 11 is a block diagram illustrating the common source line controller in the control circuit of FIG. 10 according to example embodiments.

FIG. 11 is a block diagram illustrating the common source line controller in the control circuit of FIG. 10 according to example embodiments.

Referring to FIG. 11, the common source line controller 550 may include a register 560, a comparator 570 and a driver control signal generator 580.

The register 560 may store at least one reference address RWL_ADDR1 and RWL_ADDR2. When the mode signal MS indicates a program operation of the nonvolatile memory device 30, the register 560 provides the comparator 570 with the at least one reference address RWL_ADDR1 and RWL_ADDR2.

The comparator 570 compares the row address (or an access address) R_ADDR with the at least one reference address RWL_ADDR1 and RWL_ADDR2. The comparator 570 may provide a comparison signal CS indicating a result of comparison of the row address (or the access address) R_ADDR with the at least one reference address RWL_ADDR1 and RWL_ADDR2 and a difference signal DS indicating a difference between the row address (or the access address) R_ADDR and the at least one reference address RWL_ADDR1 and RWL_ADDR2.

The driver control signal generator 580 may generate the driver control signal CDCTL to generate the common source line driver 700 in response to at least one of the common source line driver 700.

The at least one reference address RWL_ADDR1 and RWL_ADDR2 may be addresses for determining whether the selected word-line by the row address R_ADDR is adjacent to the common source line CSL. For example, the comparator 570 compares the row address R_ADDR with a first reference address RWL_ADDR1, and provides the driver control signal generator 580 with the comparison signal CS indicating whether the row address R_ADDR is smaller than the first reference address RWL_ADDR1 and the difference signal DS indicating a difference between the row address R_ADDR and the first reference address RWL_ADDR1. The comparison signal CS has a first logic level (logic low level) when the row address R_ADDR is smaller than or equal to the first reference address RWL_ADDR1. The comparison signal CS has a second logic level (logic low level) when the row address R_ADDR is smaller than or equal to the first reference address RWL_ADDR1. The driver control signal generator 580 may provide the common source line driver 700 with at the driver control signal CDCTL in response to at least one of the comparison signal CS and the difference signal DS.

The driver control signal CDCTL may include a plurality of bits, a first bit of the driver control signal CDCTL may indicate a program operation of the nonvolatile memory device 30, a second bit of the driver control signal CDCTL may indicate a logic level of the comparison signal CS and rest bits of the driver control signal CDCTL may indicate a position of the selected word-line based on the difference signal DS.

In example embodiments, the common source line driver 700 may float the common source line CSL before a program operation is performed on a selected page connected to the selected word-line irrespective of a position of the selected word-line based on the first bit of the driver control signal CDCTL when the mode signal MS indicates a program operation of the nonvolatile memory device 30.

In example embodiments, the common source line driver 700, in response to the first bit and the second bit of the driver control signal CDCTL, may float the common source line CSL at a first timing when the row address R_ADDR is smaller than or equal to the first reference address RWL_ADDR1 or may float the common source line CSL at a second timing when the row address R_ADDR is greater than the first reference address RWL_ADDR1. The first timing may be earlier than the second timing.

When the common source line driver 700 floats the common source line CSL based on the driver control signal CDCTL, the common source line driver 700 floats the common source line CSL at a timing before a voltage level of a program inhibit bit-line is saturated.

Figure 12:
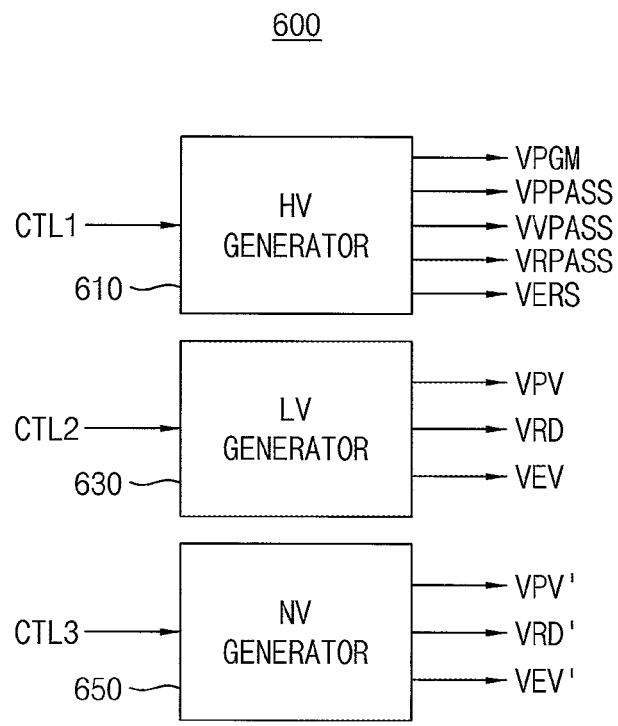
FIG. 12 is a block diagram illustrating the voltage generator in the nonvolatile memory device of FIG. 2 according to example embodiments.

FIG. 12 is a block diagram illustrating the voltage generator in the nonvolatile memory device of FIG. 2 according to example embodiments.

Referring to FIG. 12, the voltage generator 600 includes a high voltage generator 610 and a low voltage generator 630. The voltage generator 600 may further include a negative voltage generator 650.

The high voltage generator 610 may generate a program voltage PGM, a program pass voltage VPPASS, a verification pass voltage VVPASS, a read pass voltage VRPASS and an erase voltage VERS according to operations directed by the decoded command D_CMD, in response to a first control signal CTL1. The program voltage PGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the number of the program/erase cycles indicated by the comparison signal CS.

The low voltage generator 630 may generate a program verification voltage VPV, a read voltage VRD and an erase verification voltage VER according to operations directed by the decoded command D_CMD, in response to a second control signal CTL2. The program verification voltage VPV, the read voltage VRD and the erase verification voltage VER may be applied to the selected word-line according to operation of the nonvolatile memory device 100. The second control signal CTL2 may include a plurality of bits which indicate the operations directed by the decoded command D_CMD.

The negative voltage generator 650 may generate a program verification voltage VPV', a read voltage VRD' and an erase verification voltage VER' which have negative levels according to operations directed by the decoded command D_CMD, in response to a third control signal CTL3. The third control signal CTL3 may include a plurality of bits which indicate the operations directed by the decoded command D_CMD.

Figure 13:
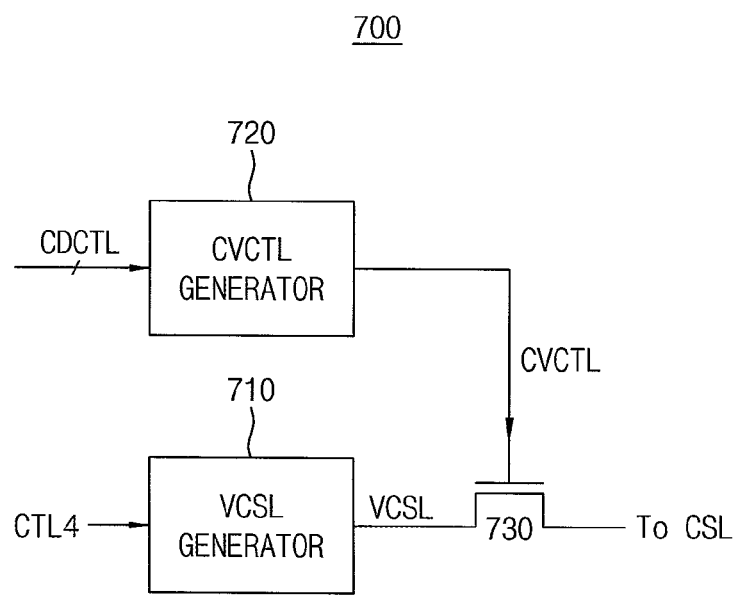
FIG. 13 illustrates the common source line driver in the nonvolatile memory device of FIG. 2 according to example embodiments.

FIG. 13 illustrates the common source line driver in the nonvolatile memory device of FIG. 2 according to example embodiments.

Referring to FIG. 3, the common source line driver 700 may include a common source line voltage generator 710, a voltage control signal generator 720 and a transistor 730. The common source driver 700 may be embodied using one or more circuits or circuitry (e.g., hardware) to carry out the following functions of the common source driver 700.

The common source line voltage generator 710 may generate the common source line voltage VCSL applied to the common source line CSL in response to a control signal CTL4 of the control signal generator 530. The voltage control signal generator 720 may generate a common source line voltage control signal CVCTL in response to the driver control signal CDCTL. The transistor 730 may have a first terminal coupled to the common source line CSL, a second terminal receiving the common source line voltage VCSL and a gate receiving the common source line voltage control signal CVCTL. Therefore, the transistor 730 may adjust a level of the common source line voltage VCSL applied to the common source line CSL or may cut off the common source line voltage VCSL applied to the common source line CSL to float the common source line CSL according to the common source line voltage control signal CVCTL.

As described above, the voltage control signal generator 720 may disable the common source line voltage control signal CVCTL to a low level and cut off the common source line voltage VCSL in response to the driver control signal CDCTL to float the common source line CSL at a timing before a voltage level of a program inhibit bit-line is saturated. In addition, the voltage control signal generator 720, in response to the driver control signal CDCTL, may adjust a timing of floating the common source line CSL by adjusting a timing of disabling the common source line voltage control signal CVCTL to a low level according to a position of the selected word-line.

Figure 14:
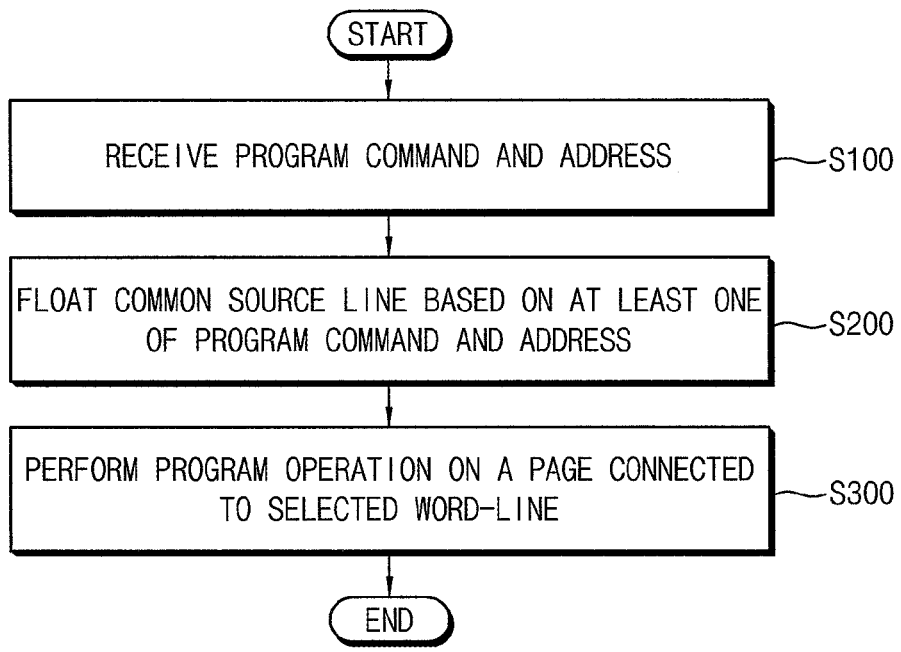
FIG. 14 is a flowchart illustrating a method of operating a nonvolatile memory device according to example embodiments.

FIG. 14 is a flowchart illustrating a method of operating a nonvolatile memory device according to example embodiments.

Referring to FIGS. 2 through 14, in a method of operating a nonvolatile memory device 30 including a plurality of cell strings NS1~NSn, each including a first selection transistor SST coupled to a string selection line SSL, a second selection transistor GST coupled to a ground selection line GSL and a plurality of memory cells MCs coupled to a plurality word-lines WLs, wherein the second selection transistors GST are commonly coupled to a common source line CSL, the nonvolatile memory device 30 receives a command CMD and an access address ADDR from the memory controller 20 (S100). The common source line controller 550 controls the common source line driver 700 to float the common source line CSL based on at least one of the command CMD and the address ADDR (S200). The control circuit 500 controls the voltage generator 600 by the control signals CTLs such that a program operation is performed on the selected page coupled to the selected word-line designated by the access address ADDR (S300).

Figure 15:
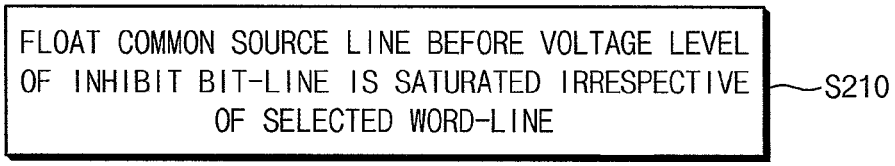
FIG. 15 illustrates an example of the step in a method of operating a nonvolatile memory device of FIG. 14.

FIG. 15 illustrates an example of the step S200 in a method of operating a nonvolatile memory device of FIG. 14.

Referring to FIG. 15, for floating the common source line CSL (S200a), in operation S210, the voltage control signal generator 720, in response to the driver control signal CDCTL, may float the common source line CSL at a timing before a voltage level of a program inhibit bit-line is saturated irrespective of the position of the selected word-line designated by the access address ADDR as described with reference to FIGS. 10, 11 and 13. The floating state of the common source line CSL may be maintained until the program operation is completed on the selected page coupled to the selected word-line designated by the access address ADDR.

Figure 16:
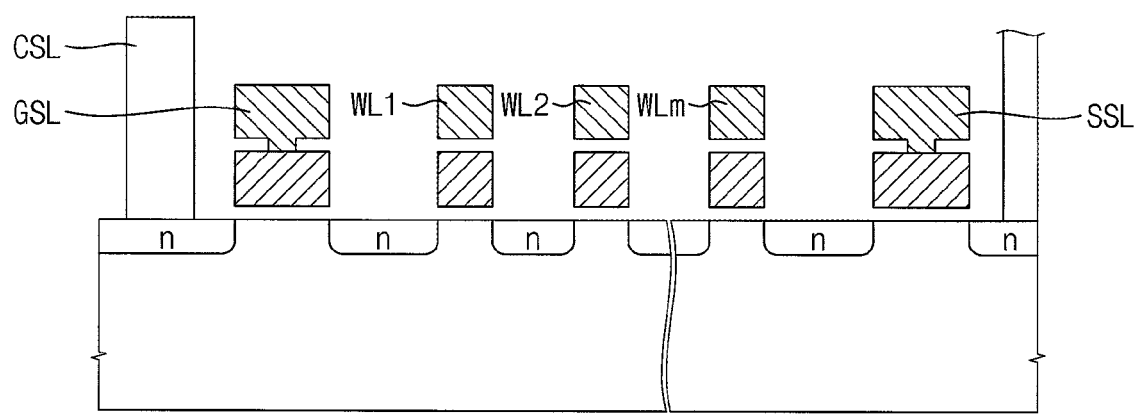
FIG. 16 illustrates a portion of a memory cell array to which the method of FIG. 14 is applied.

FIG. 16 illustrates a portion of a memory cell array to which the method of FIG. 14 is applied.

FIG. 16 illustrates one of the memory blocks BLK1~BLKz of the memory cell array 100 of FIG. 2.

According to the method of FIG. 15, the common source line CSL may be floated at a timing before a voltage level of a program inhibit bit-line is saturated irrespective of the position of the selected word-line designated by the access address ADDR.

Figure 17:
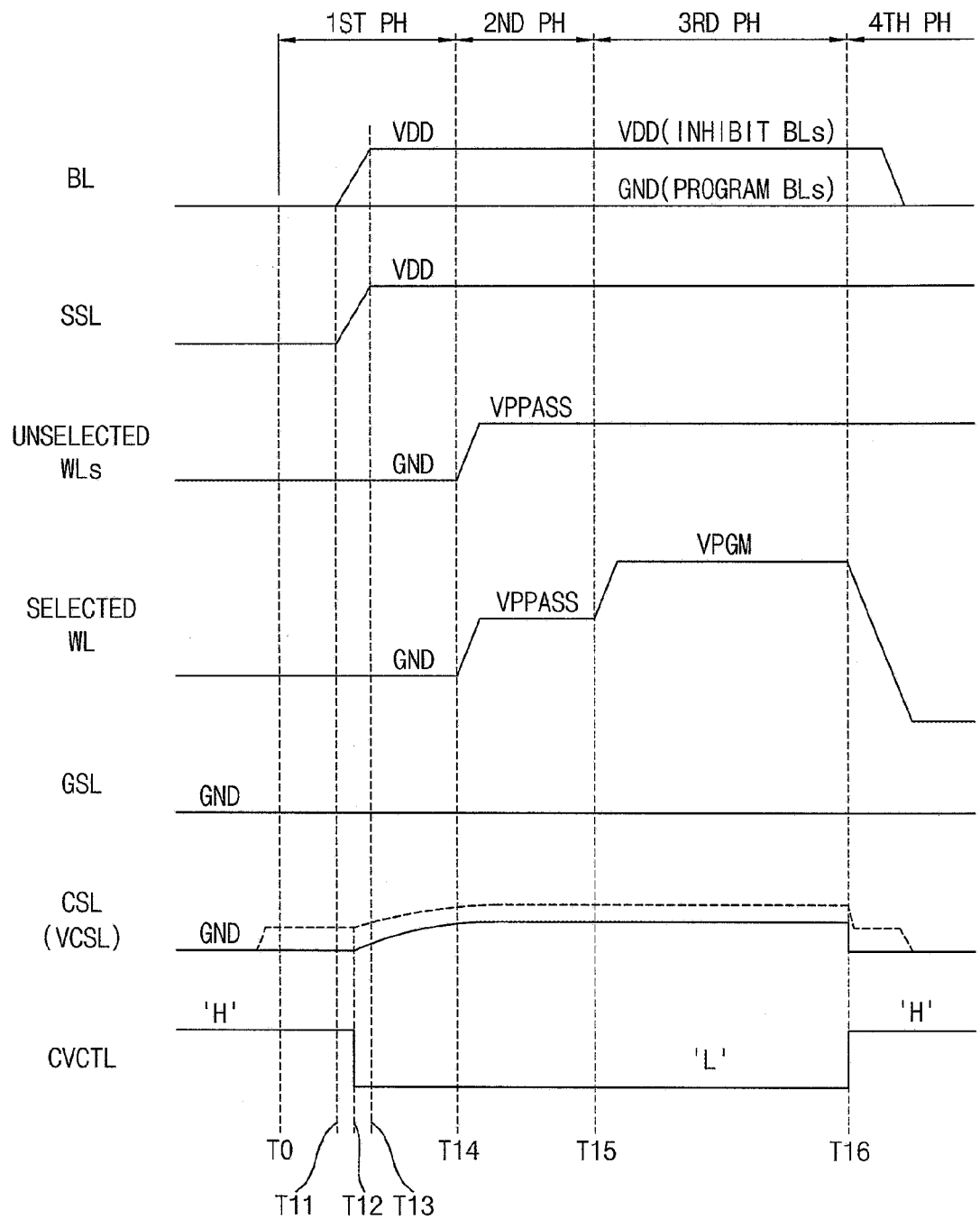
FIG. 17 illustrates changes of various lines and signals when the method of FIG. 14 is applied to the memory block of FIG. 16.

FIG. 17 illustrates changes of various lines and signals when the method of FIG. 14 is applied to the memory block of FIG. 16.

Referring to FIGS. 13 through 17, the common source line CSL is driven to a level of the ground voltage GND or a level higher than the ground voltage GND between time points T0 and T11. At a time point T12, the common source line voltage control signal CVCTL is deactivated to a low level to cut off the common source line voltage VCSL applied to the common source line CSL, and thus the common source line CSL is floated. When the common source line voltage VCSL cut off, a voltage of the common source lien CSL is coupled to a voltage of a program inhibit bit-lines INHIBIT BLs. T13 shows when a voltage level of the inhibit bit-line is saturated. When a program voltage is applied to the selected word-line, the voltage of the common source line CSL is floated. Therefore, a leakage current of the ground selection line GSL may be reduced by increasing potential of a channel under the common source line CSL without applying a voltage to the common source line CSL.

During a first phase 1ST PH between time points T1 and T14, the power supply voltage VDD is applied to the program inhibit bit-lines INHIBIT BLs and the string selection line SSL.

During a second phase 2ND PH between time points T14 and T15, the power supply voltage VDD is applied to the program inhibit bit-lines INHIBIT BLs, the ground voltage GND is applied to program bit-lines PROGRAM BLs, a program pass voltage VPPASS is applied to the word-lines WLs and the ground voltage GND is applied to the ground selection line GSL.

During a third phase 3RD PH between time points T15 and T16, the power supply voltage VDD is applied to the program inhibit bit-lines INHIBIT BLs, the ground voltage GND is applied to program bit-lines PROGRAM BLs, the program pass voltage VPPASS is applied to the unselected word-lines UNSELECTED WLs and the program voltage VPGM is applied to the selected word-line SELECTED WL.

In a fourth phase 4TH PH after time point T16, the program inhibit bit-lines INHIBIT BLs are discharged to the ground voltage GND, the word-lines WLs are discharged to the ground voltage GND, and the common source line voltage control signal CVCTL is activated to a high level 'H' such that the common source line voltage VCSL is applied to the common source line CSL.

Figure 18:
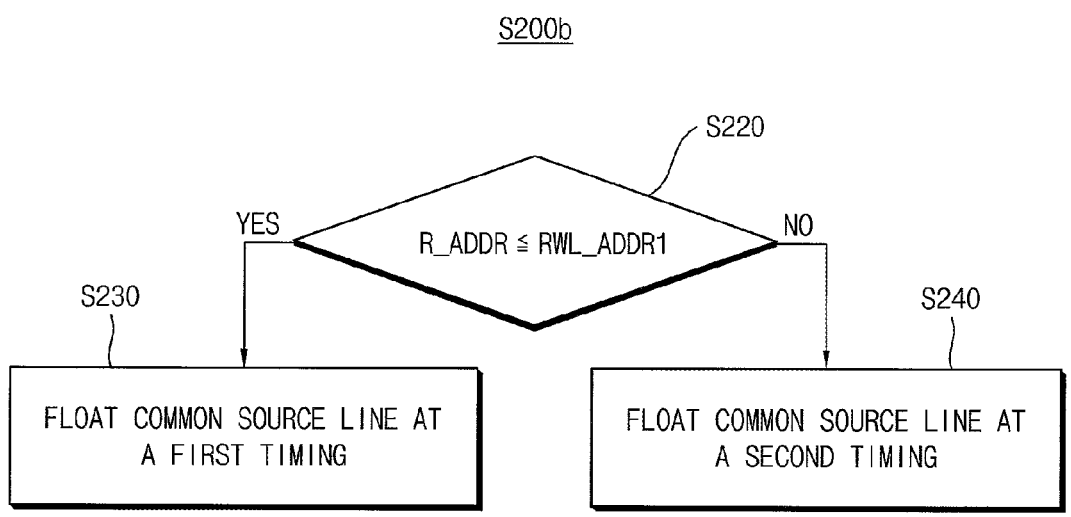
FIG. 18 illustrates an example of the step in the method of FIG. 14.
Figure 19:
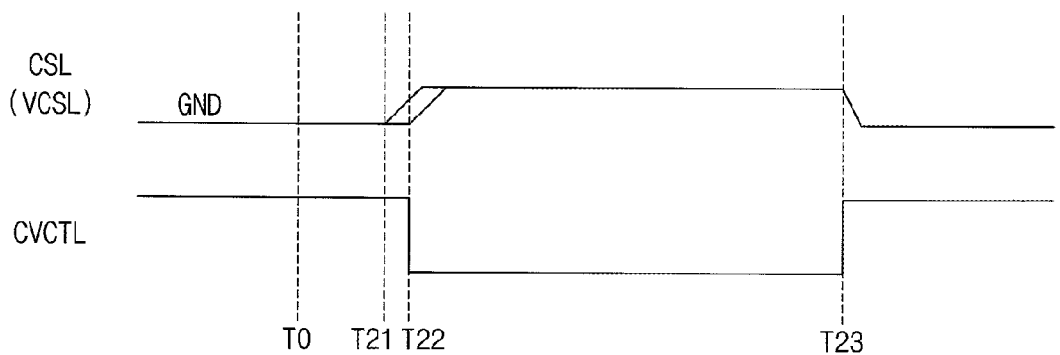

FIG. 18 illustrates an example of the operation S200 in the method of FIG. 14 and FIG. 19 illustrates an example to which the method of FIG. 18 is applied to.

Referring to FIGS. 18 and 19, for floating the common source line CSL (S200b), the comparator 570 compares the access address R_ADDR with the at least one reference address RWL_ADDR1 (S220) and the voltage control signal generator 720 floats the common source line CSL at a timing before a voltage level of the program inhibit bit-line is saturated. The common source line controller 550 may adjust a timing of floating the common source line CSL according to a position of the selected word-line by the access address R_ADDR (S230, S240).

When the access address is smaller than or equal to the at least one reference address in the operation (S220), the common source line CSL is floated at a first timing T21 before a voltage level of the program inhibit bit-line is saturated (S230).

When the access address is greater than the at least one reference address in the operation (S220), the common source line CSL is floated at a second timing T22 before a voltage level of the program inhibit bit-line is saturated (S240). The first timing may be earlier than the second timing. When the program operation is completed on the selected word-line, the common source line voltage control signal CVCTL is activated to a high level such that the common source line voltage VCSL is applied to the common source line CSL at a timing T23.

Figure 20:
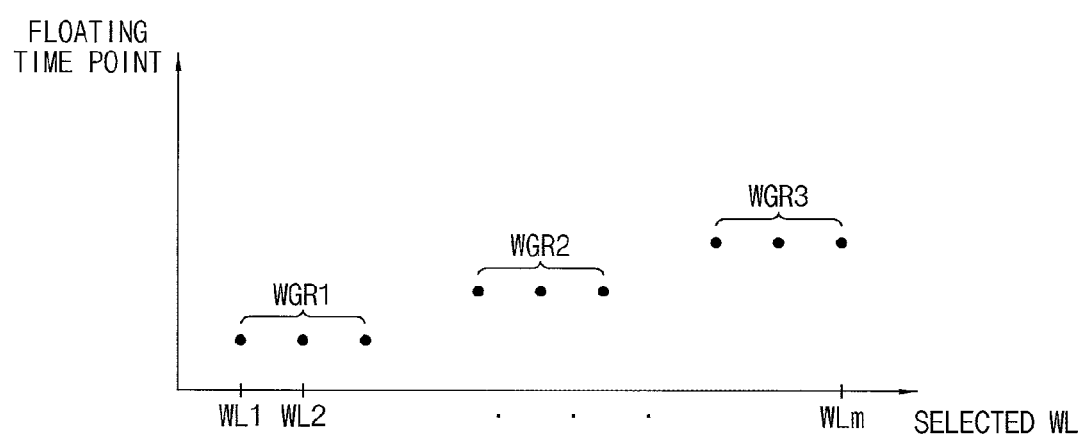
FIG. 20 illustrates an example in which the common source line is floated in the method of FIG. 14 according to example embodiments.

FIG. 20 illustrates an example in which the common source line is floated in the method of FIG. 14 according to example embodiments.

Referring to FIG. 20, when the at least one reference address includes a plurality of reference addresses RWL_ADDR1 and RWL_ADDR2 as described with reference to FIG. 11, the word-lines WL1~WLm may be grouped into a plurality of word-line groups WGR1, WGR2 and WGR3 based on the reference addresses RWL_ADDR1 and RWL_ADDR2, and a timing of floating the common source line CSL may be varied for each of the word-line groups WGR1, WGR2 and WGR3 by comparing the access address R_ADDR with the reference addresses RWL_ADDR1 and RWL_ADDR2. That is, for word-lines in the same word-line group, the common source line CSL may be floated at a same timing.

Figure 21:
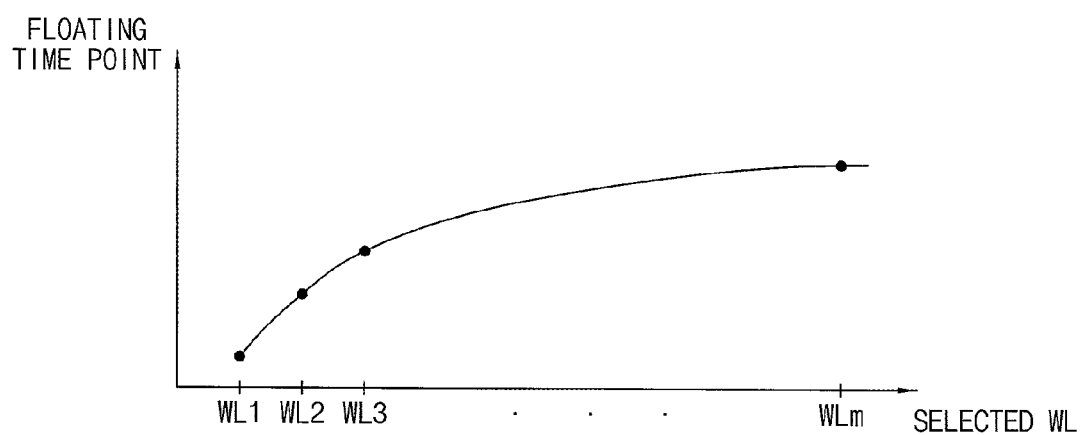
FIG. 21 illustrates an example in which the common source line is floated in the method of FIG. 14 according to example embodiments.

FIG. 21 illustrates an example in which the common source line is floated in the method of FIG. 14 according to example embodiments.

Referring to FIG. 21, the access word-line R_ADDR is compared with the reference word-line RWL_ADDR1 as described with reference to FIG. 11, a timing of floating the common source line CSL may be varied according to a position of the selected word-line designated by the access address R_ADDR, from the common source line CSL. For example, the timing of floating the common source line CSL may become earlier as the position of the selected word-line is nearer to the common source line CSL. When a distance of the selected word-line from the common source line CSL is equal to or greater than a first distance, the timing of floating the common source line CSL may be saturated.

As mentioned above, the common source line CSL is floated at a timing before a voltage level of a program inhibit bit-line is saturated or a timing of floating the common source line CSL is varied according to the position of the selected word-line such that a leakage current of the ground selection line GSL may be reduced by increasing potential of a channel under the common source line CSL without applying a voltage to the common source line CSL although the program voltage is applied to the selected word-line. Therefore, a program disturbance may be prevented or reduced.

Figure 22:
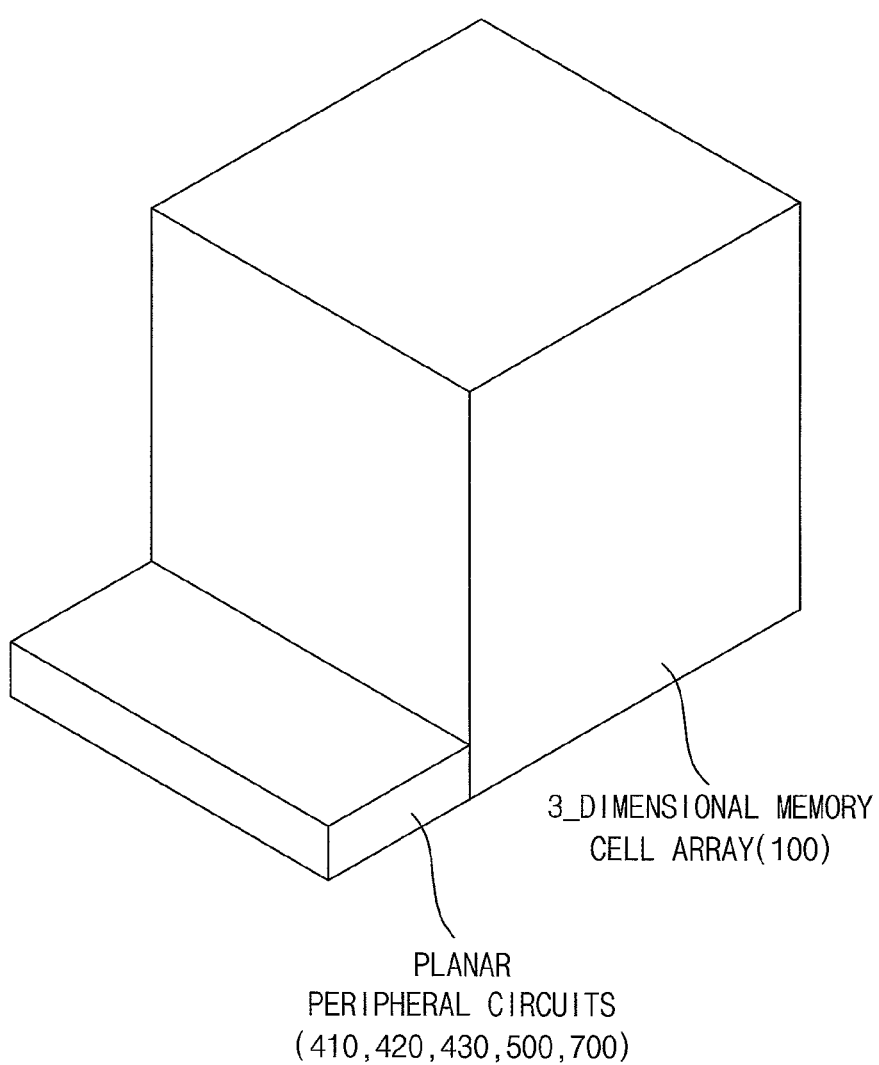
FIG. 22 is a perspective view illustrating a structure of the nonvolatile memory device described with reference to FIG. 2.

FIG. 22 is a perspective view illustrating a structure of the nonvolatile memory device described with reference to FIG. 2.

Referring to FIG. 22, the nonvolatile memory device 30 includes a three-dimensional memory cell array 100 and planar peripheral circuits 410, 420, 430, 500, and 700.

As described with reference to FIGS. 7 through 9, the memory cell array 100 may include memory cells stacked in a direction intersecting the substrate 111. That is, the memory cell array 100 may have a three-dimensional structure in which memory cells are three-dimensionally arranged. The peripheral circuits 410, 420, 430, 500, and 700 may include devices provided on the substrate 111 in a single layer. That is, the peripheral circuits 410, 420, 430, 500, and 700 may include devices having a planar structure.

For example, it is illustrated that the peripheral circuits 410, 420, 430, 500, and 700 are provided at one side of the three-dimensional memory cell array 110. However, the position relationship of the peripheral circuits 410, 420, 430, 500, and 700 and their number are not limited.

For example, the peripheral circuits 410, 420, 430, 500, and 700 may be provided on at least two sides of the three-dimensional memory cell array 100. Additionally, at least two three-dimensional memory cell arrays 100 are provided and the plane peripheral circuits 410, 420, 430, 500, and 700 may be provided on at least one side of each of at least two three-dimensional memory cell arrays 100.

Figure 23:
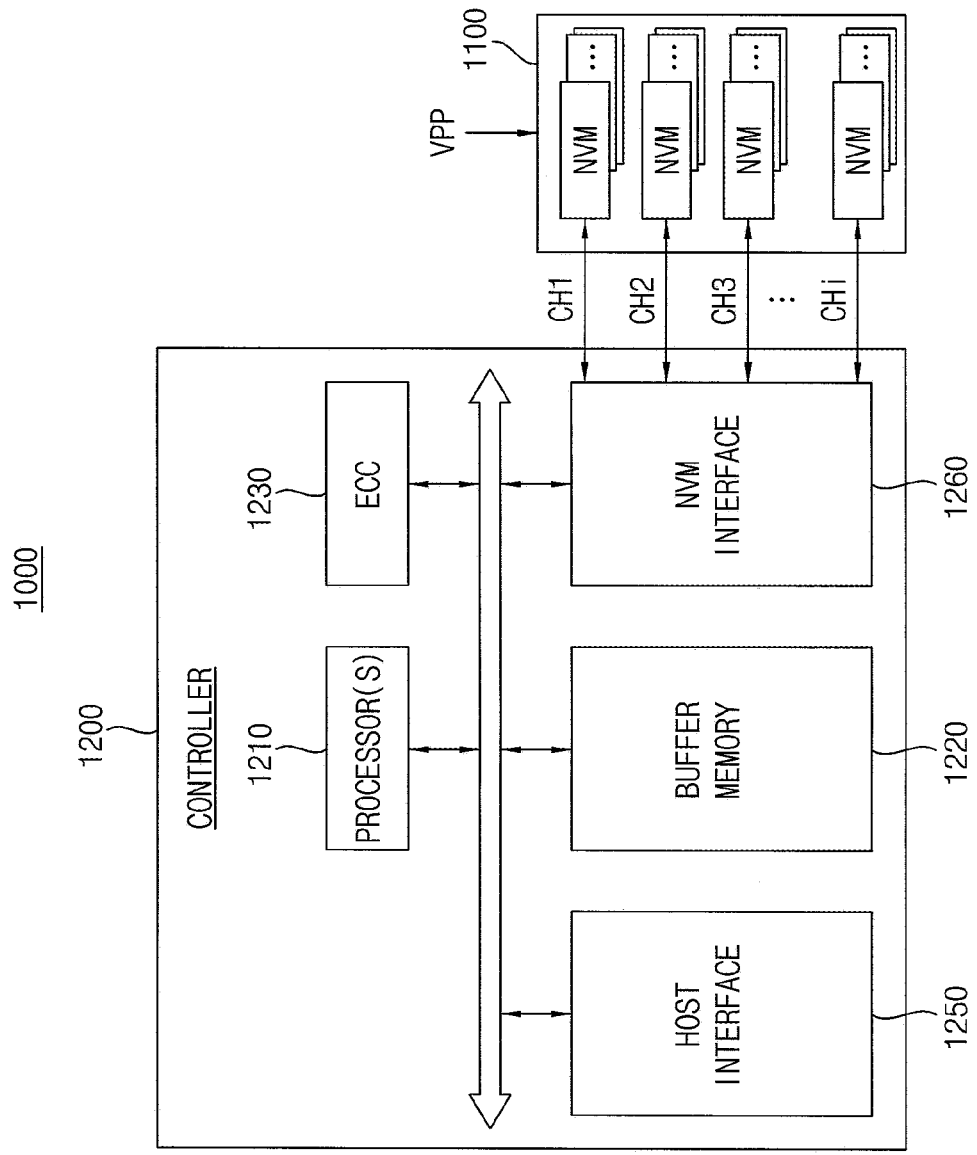
FIG. 23 is a block diagram illustrating a solid state disk or solid state drive (SSD) according to example embodiments.

FIG. 23 is a block diagram illustrating a solid state disk or solid state drive (SSD) according to example embodiments.

Referring to FIG. 23, an SSD 1000 includes multiple nonvolatile memory devices 1100 and a SSD controller 1200.

The nonvolatile memory devices 1100 optionally may be supplied with an external high voltage VPP. Each of the nonvolatile memory devices 1100 may employ the nonvolatile memory device 30 of FIG. 2. Each of the nonvolatile memory devices 1100 may include a memory cell array, a common source line driver and a common source line controller that controls the common source line driver. The common source line controller controls the common source line driver such that a common source line is floated before a program operation is performed on a page selected by an access address.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, inventive concepts are not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 23, a code memory may be further included to store code data used to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 24:
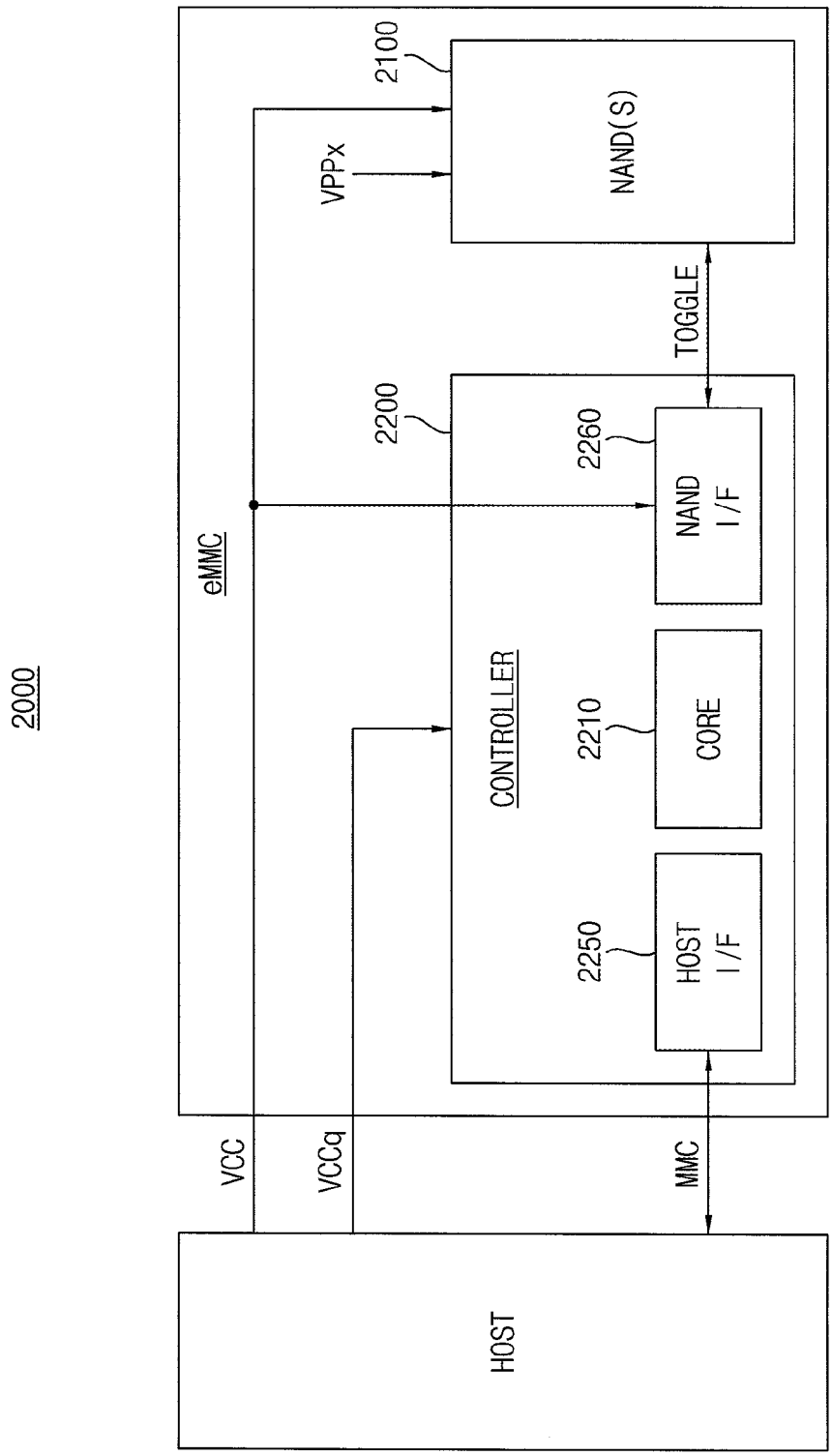
FIG. 24 is a block diagram illustrating an embedded multi-media card (eMMC) according to example embodiments.

FIG. 24 is a block diagram illustrating an embedded multi-media card (eMMC) according to example embodiments.

Referring to FIG. 24, an eMMC 2000 includes one or more NAND flash memory devices 2100 and a controller 2200.

The NAND flash memory device 2100 may employ the nonvolatile memory device 30 of FIG. 2. The NAND flash memory device 2100 may include a memory cell array, a common source line driver and a common source line controller that controls the common source line driver. The common source line controller controls the common source line driver such that a common source line is floated before a program operation is performed on a page selected by an access address.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2200 and a host. The NAND interface 2260 is configured to provide an interface between the NAND flash memory device 2100 and the controller 2200. In example embodiments, the host interface 2250 may be a parallel interface (e.g., an MMC interface). Alternatively, in example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In example embodiments, eMMC 2000 may be optionally supplied with an external high voltage VPPx.

Figure 25:
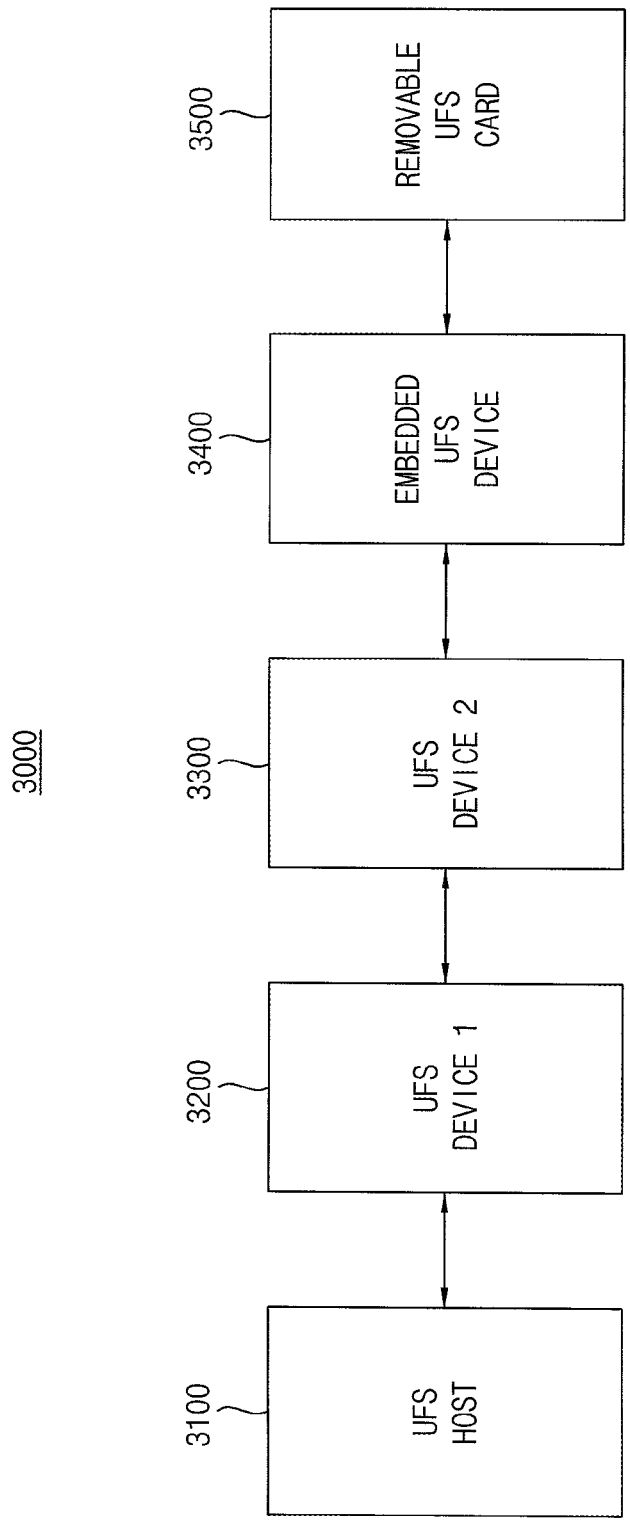
FIG. 25 is a block diagram illustrating a universal flash storage (UFS) according to example embodiments.

FIG. 25 is a block diagram illustrating a universal flash storage (UFS) according to example embodiments.

Referring to FIG. 25, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 30 of FIG. 2. Therefore, at least one of the UFS devices 3200 and 3300, the embedded UFS device 3400, and the removable UFS card 3500 may include a memory cell array, a common source line driver and a common source line controller that controls the common source line driver. The common source line controller controls the common source line driver such that a common source line is floated before a program operation is performed on a page selected by an access address.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 26:
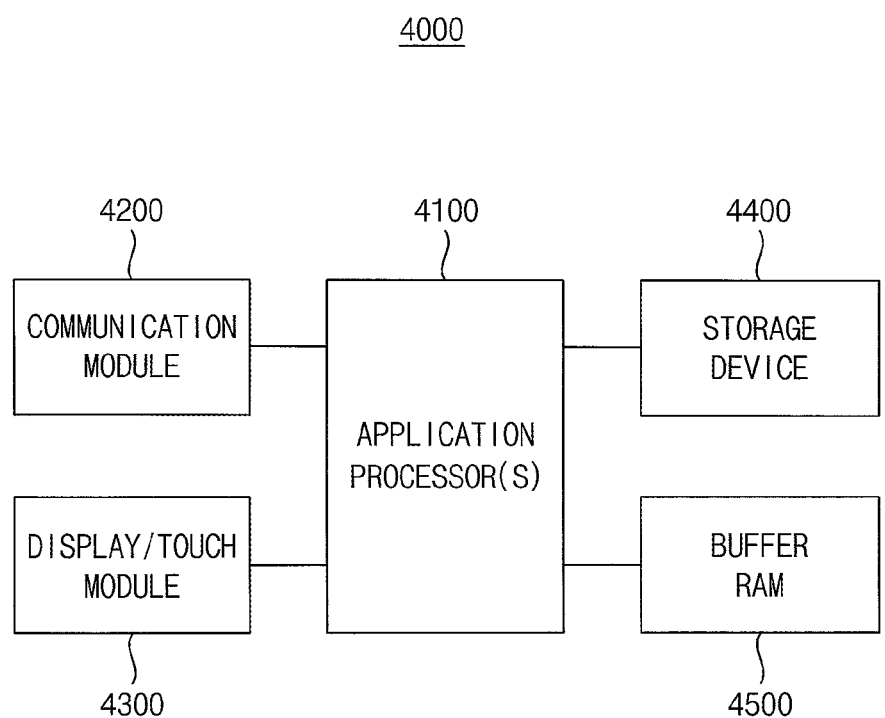
FIG. 26 is a block diagram illustrating a mobile device according to example embodiments.

FIG. 26 is a block diagram illustrating a mobile device according to example embodiments.

Referring to FIG. 26, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may employ the nonvolatile memory device 30 of FIG. 2. The storage device 4400 may include a memory cell array, a common source line driver and a common source line controller that controls the common source line driver. The common source line controller controls the common source line driver such that a common source line is floated before a program operation is performed on a page selected by an access address.

The mobile RAM 4500 temporarily stores data used for processing operations of the mobile device 4000.

A memory device or a storage device according to example embodiments of inventive concepts may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Example embodiments of inventive concepts may be applied to various devices and systems. For example, example embodiments of inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of operating a nonvolatile memory device, the nonvolatile memory device including a common source line connected to a plurality of cell strings, the plurality of cell strings each including a first selection transistor coupled to a string selection line, a second selection transistor coupled to a ground selection line, and a plurality of memory cells coupled to a plurality of word-lines, the second selection transistors being commonly coupled to the common source line, the method comprising:
receiving a program command and an access address; and
performing a program operation on a selected page according to the access address while floating the common source line, the common source line being floated based on at least one of the program command and the access address, the floating the common source line being maintained until the program operation on the selected page is completed,
wherein the nonvolatile memory device includes bit-lines connected to the plurality of cell strings,
the performing the program operation includes,
selecting a selected word-line among the word-lines based on the access address,
applying a program inhibit voltage to a program inhibit bit-line among the bit-lines,
comparing the access address with at least one reference address,
the floating the common source line begins before a voltage level of a program inhibit bit-line is saturated, and
varying a timing of the floating the common source line according to a position of the selected word-line based on a result of the comparing the access address with the at least one reference address.

2. The method of claim 1, wherein
the varying the timing of the floating the common source line includes floating the common source line at a first timing if the access address is smaller than or equal to the at least one reference address, and
the first timing begins before the voltage level of the program inhibit bit-line is saturated.

3. The method of claim 2, wherein
the varying the timing of the floating the common source line includes floating the common source line at a second timing if the access address is greater than the at least one reference address,
the second timing begins before the voltage level of the program inhibit bit-line is saturated, and
the second timing begins later than the first timing.

4. The method of claim 1, wherein
the at least one reference address is a plurality of reference addresses,
the plurality of word-lines are grouped into a plurality of word-line groups based on the reference addresses, and
the performing the program operation includes varying the timing of the floating the common source line for each of the word-line groups based on the result of the comparing the access address with the reference addresses.

5. The method of claim 1, wherein the varying the timing of the floating the common source line includes beginning the floating the common source line earlier as the position of the selected word-line is nearer to the common source line.

6. A nonvolatile memory device comprising:
a memory cell array including a common source line connected to a plurality of cell strings, the cell strings each including a first selection transistor coupled to a string selection line, a second selection transistor coupled to a ground selection line, and a plurality of memory cells coupled to a plurality of word-lines, the second selection transistors being commonly coupled to the common source line;
a common source line driver configured to apply a common source line voltage to the common source line; and
a control circuit,
the control circuit including a common source line controller configured to provide a driver control signal to the common source line driver based on a command and an access address,
the common source line controller being configured to control the common source line driver using the driver control signal,
the common source line controller being configured to control the common source line driver to float the common source line while a program operation is performed on a selected page according to the access address, the common source line driver being configured to float the common source line until the program operation on the selected page is completed,
wherein the common source line controller includes,
a register configured to store at least one reference address,
a comparator configured to compare the access address with the at least one reference address, the comparator being configured to output a comparison signal and a difference signal, the comparison signal indicating a result of comparing the access address and the at least one reference address, the difference signal indicating a difference between the access address and the at least one reference address, and a driver control signal generator configured to generate the driver control signal in response to a mode signal and at least one of the comparison signal and the difference signal.

7. The nonvolatile memory device of claim 6, further comprising:

an address decoder configured to select a selected word-line during the program operation based on the access address, wherein the memory cell array includes a substrate and bit-lines connected to the cell strings, the cell strings are vertically arranged on the substrate, the common source line controller is configured to control the common source line driver during the program operation to float the common source line before a voltage level of a program inhibit bit-line among the bit-lines is saturated irrespective of a position of the selected word-line.

8. The nonvolatile memory device of claim 6, wherein the common source line driver includes:

a common source voltage generator configured to generate the common source line voltage applied to the common source line based on a control signal from the control circuit;

a voltage control signal generator configured to generate a common source line voltage control signal in response to the driver control signal; and a transistor including a first terminal coupled to the common source line, a second terminal configured to receive the common source line voltage, and a gate configured to receive the common source line voltage control signal.

9. The nonvolatile memory device of claim 8, wherein the memory cell array includes bit-lines connected to the cell strings, the control circuit is configured to control applying a program inhibit voltage to a program inhibit bit-line among the bit-lines during the program operation, the common source line driver, in response to the driver control signal, is configured to float the common source line at a first timing before a voltage level of the program inhibit bit-line is saturated if the access address is smaller than or equal to the at least one reference address, and the common source line driver, in response to the driver control signal, is configured to float the common source line at a second timing before the voltage level of the program inhibit bit-line is saturated if the access address is greater than the at least one reference address, and the first timing is earlier than the second timing.

10. The nonvolatile memory device of claim 8, wherein the at least one reference address is a plurality of reference addresses, the plurality of word-lines are grouped into a plurality of word-line groups based on the reference addresses, and the voltage control signal generator is configured to control the common source line voltage control signal in response to the driver control signal such that a timing of floating the common source line is varied for each of the word-line groups based on the access address and the reference addresses.

11. The nonvolatile memory device of claim 8, wherein the voltage control signal generator is configured to control the common source line voltage control signal in response to the driver control signal such that a timing of floating the common source line becomes earlier as a position of the selected word-line is nearer to the common source line.

12. A nonvolatile memory device comprising:

a memory cell array including a common source line and a plurality of bit-lines connected to a plurality of cell strings, the cell strings each including a plurality of memory cells serially connected between a first selection transistor and a second selection transistor, the first selection transistor being coupled to a string selection line, the second selection transistor being coupled to a ground selection line, the plurality of memory cells being coupled to a plurality of word-lines, the second selection transistors being commonly coupled to the common source line; and a control circuit connected to the memory cell array, the control circuit being configured to receive a program command and an address signal from outside, the control circuit being configured to generate a row address and a column address based on the address signal, and the control circuit being configured to perform a program operation on a selected page while floating the common source line, the common source line being floated based on the program command and the row address, the control circuit being configured to float the common source line until the program operation on the selected page is completed, wherein, during the program operation, the control circuit is configured to apply a ground voltage or a level higher than the ground voltage to the common source line before floating the common source line, wherein, during the program operation and after applying the ground voltage or the level higher than the ground voltage to the common source line, the control circuit is configured to apply a program inhibit voltage to a program inhibit bit-line among the bit-lines, the control circuit is configured to begin floating the common source line at a first timing or a second timing, based on the row address, before a voltage level of the program inhibit bit-line is saturated, and the second timing is after the first timing.

13. The nonvolatile memory device of claim 12, wherein the plurality of memory cells are stacked on top of each other in the plurality of cell strings.

* * * * *